US012699133B2

(12) United States Patent (10) Patent No.: US 12,699,133 B2

Toriumi (45) Date of Patent: Aug. 4, 2026

(54) OSCILLATOR AND ELECTRONIC DEVICE

(71) Applicant: SEIKO EPSON CORPORATION, Tokyo (JP)

(72) Inventor: Yuichi Toriumi, Minowa (JP)

(73) Assignee: SEIKO EPSON CORPORATION (JP)

( * ) Notice: Subject to any disclaimer, the term of this patent is extended or adjusted under 35 U.S.C. 154(b) by 425 days.

(21) Appl. No.: 18/395,864

(22) Filed: Dec. 26, 2023

(65) Prior Publication Data

US 2024/0210469 A1     Jun. 27, 2024

(30) Foreign Application Priority Data

Dec. 27, 2022     (JP) ................................. 2022-209149

(51) Int. Cl.
G01R 31/317 (2006.01)
H03L 7/099 (2006.01)

(52) U.S. Cl.
CPC ........ G01R 31/31727 (2013.01); H03L 7/099 (2013.01)

(58) Field of Classification Search
CPC .......................... G01R 31/31727; H03L 7/099
See application file for complete search history.

(56) References Cited

U.S. PATENT DOCUMENTS

| | | | | |
|---|---|---|---|---|
| 5,610,954 A | * | 3/1997 | Miyashita | ............. H03L 7/0891 |
| | | | | 331/25 |
| 11,201,588 B2 | * | 12/2021 | Haneda | .................... H03B 5/04 |
| 2009/0224818 A1 | * | 9/2009 | Yoneyama | ................ H02P 7/04 |
| | | | | 327/333 |
| 2019/0170594 A1 | * | 6/2019 | Aoyama | ............. G01K 15/007 |

FOREIGN PATENT DOCUMENTS

JP        2005-033241 A     2/2005

* cited by examiner

*Primary Examiner* — Elias Desta
(74) *Attorney, Agent, or Firm* — Harness, Dickey & Pierce, P.L.C.

(57) ABSTRACT

An oscillator includes a power supply terminal to which a high-potential-side power supply voltage is supplied, a ground terminal to which a low-potential-side power supply voltage is supplied, a clock terminal that outputs a clock signal, an output control terminal to which an output control signal of the clock signal is input, and a failure diagnosis terminal that outputs a failure diagnosis signal. The output control terminal receives the output control signal having a first logic which is one of a positive logic and a negative logic, and the failure diagnosis terminal outputs the failure diagnosis signal having a second logic which is the other one of the positive logic and the negative logic.

15 Claims, 10 Drawing Sheets

EL1-EL2 COUPLING: CLOCK OUTPUT CONTROL BY CONTROL DEVICE
EL3-EL2 COUPLING: AUTOMATIC CONTROL OF CLOCK OUTPUT BY SELF-FAILURE DIAGNOSIS
EL4-EL2 COUPLING: CONSTANT CLOCK OUTPUT

OSCILLATOR AND ELECTRONIC DEVICE

The present application is based on, and claims priority from JP Application Serial Number 2022-209149, filed Dec. 27, 2022, the disclosure of which is hereby incorporated by reference herein in its entirety.

BACKGROUND

1. Technical Field

The present disclosure relates to an oscillator, an electronic device, and the like.

2. Related Art

In recent years, there has been an increasing demand for reliability of oscillators. For example, JP-A-2005-33241 discloses a clock control device capable of reducing a frequency of occurrence of system down by using an input clock signal to a PLL circuit as a system clock signal when a PLL error occurs.

In the related art, an error signal is output when an unlock of a PLL is detected, but there is no disclosure about a specific output mode of the error signal and an arrange manner of a terminal from which the error signal is output. For example, when a problem such as a short circuit between an output terminal of the error signal and an output control terminal of a clock occurs, clock output may be stopped although a self-diagnosis result is normal.

SUMMARY

An aspect of the disclosure relates to an oscillator that includes: a power supply terminal to which a high-potential-side power supply voltage is supplied; a ground terminal to which a low-potential-side power supply voltage is supplied; a clock terminal configured to output a clock signal; an output control terminal to which an output control signal of the clock signal is input; and a failure diagnosis terminal configured to output a failure diagnosis signal. The output control terminal is configured to receive the output control signal having a first logic which is one of a positive logic and a negative logic. The failure diagnosis terminal is configured to output the failure diagnosis signal having a second logic which is the other one of the positive logic and the negative logic.

Another aspect of the disclosure relates to an electronic device including the oscillator described above and a circuit board to which the oscillator is provided.

DESCRIPTION OF EMBODIMENTS

Hereinafter, an embodiment will be described. The embodiment to be described below does not unduly limit the scope of the claims. In addition, all of the components described in the embodiment are not necessarily essential components.

1. Oscillator

Figures 1, 2:
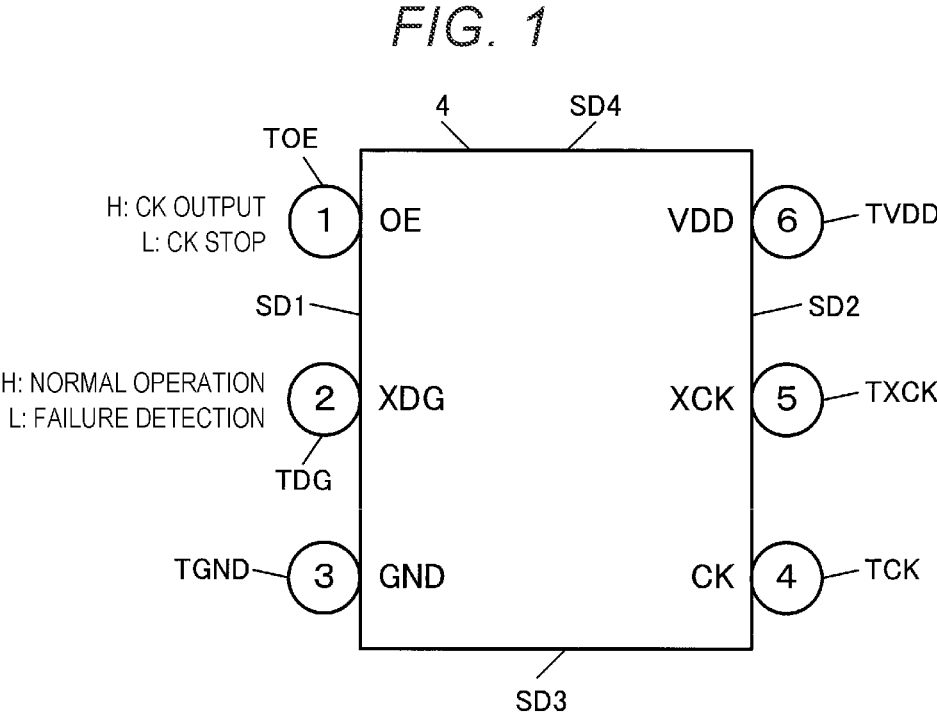
FIG. 1 is a configuration example of an oscillator according to an embodiment.
FIG. 2 is another configuration example of the oscillator according to the embodiment.
Figure 12:
FIG. 12 shows a first structural example of the oscillator.
Figure 12:
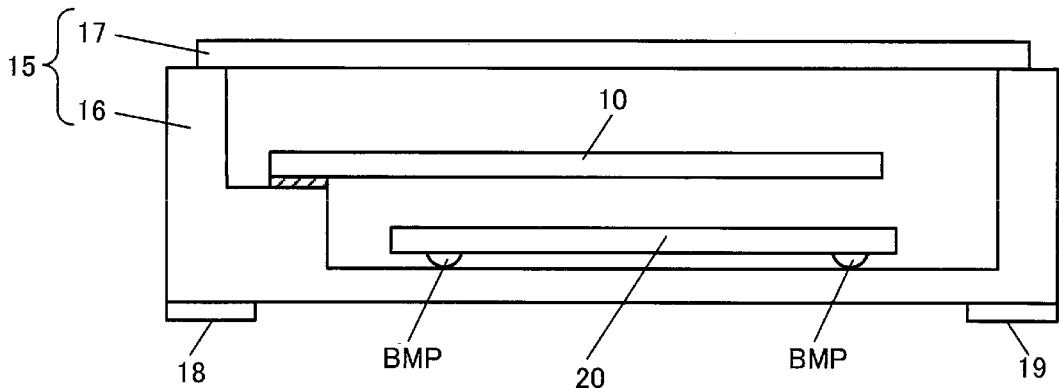
Figure 13:
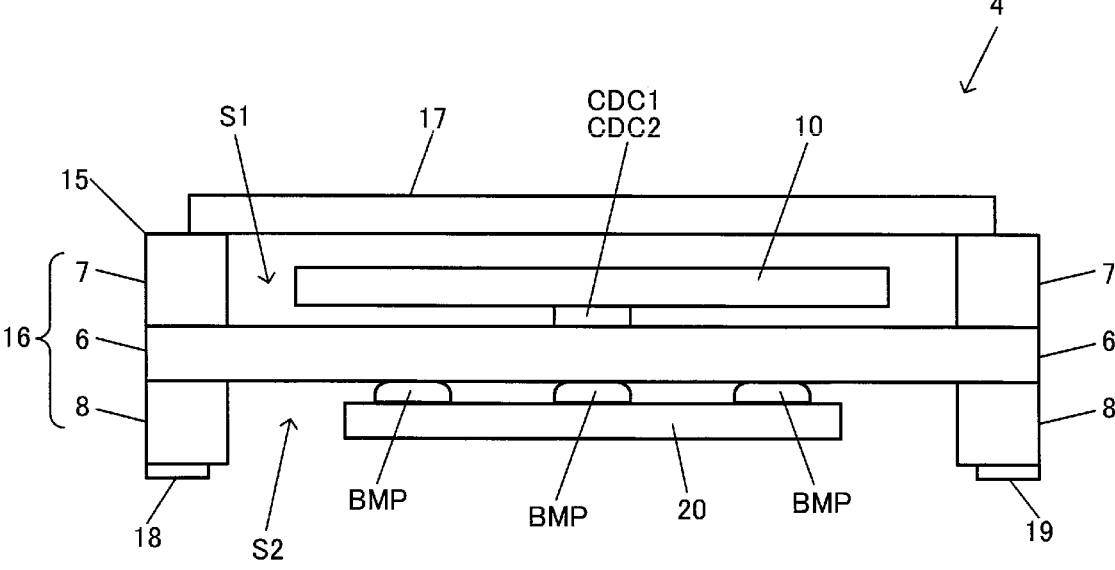
FIG. 13 shows a second structural example of the oscillator.

FIG. 1 shows a configuration example of an oscillator 4 according to the embodiment. FIG. 1 is an external view of the oscillator 4 in a plan view in a direction orthogonal to a main surface of the oscillator 4. The same applies to FIGS. 2 to 5 described later. The oscillator 4 according to the embodiment includes an output control terminal TOE, a failure diagnosis terminal TDG, a ground terminal TGND, clock terminals TCK and TXCK, and a power supply terminal TVDD. TOE, TDG, TGND, TCK, TXCK, and TVDD are, for example, a first terminal, a second terminal, a third terminal, a fourth terminal, a fifth terminal, and a sixth terminal of the oscillator 4. That is, the oscillator 4 in FIG. 1 is a six-terminal oscillator. The terminal is also referred to as a pin. The oscillator 4 includes, for example, a resonator 10 and a circuit device 20 as shown in FIG. 6 described later. The oscillator 4 includes a package 15 as shown in FIGS. 12 and 13 described later, and these terminals are provided in the package 15 of the oscillator 4.

The output control terminal TOE is a terminal to which an output control signal OE of clock signals CK and XCK is input. The output control terminal TOE and the output control signal OE are also referred to as an output enabling terminal and an output enabling signal. The output control signal OE is output by an external control device such as a microcontroller and input to the output control terminal TOE of the oscillator 4. In FIG. 1, the clock signals CK and XCK are output from the oscillator 4 when the output control signal OE is at a high level, and the output of the clock signals CK and XCK from the oscillator 4 is stopped when the output control signal OE is at a low level. The output of the clock signals CK and XCK is referred to as enabling of the output of the clock signal, and the stop of the output of the clock signals CK and XCK is referred to as disenabling of the output of the clock signal. In the embodiment, the high level and the low level are appropriately referred to as "H" and "L", respectively.

Figure 6:
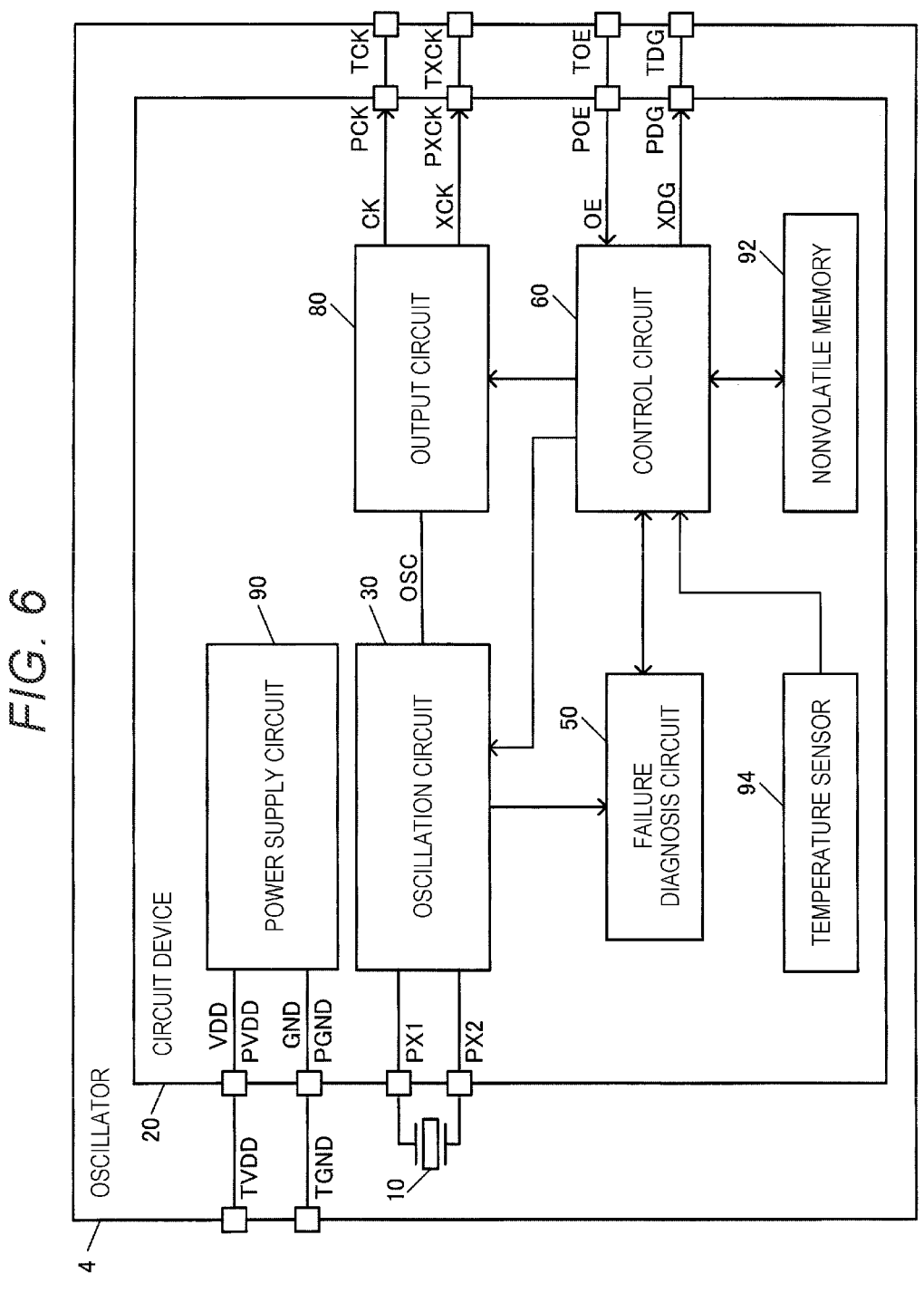
FIG. 6 is a configuration example of a circuit device provided in the oscillator.
Figure 7:
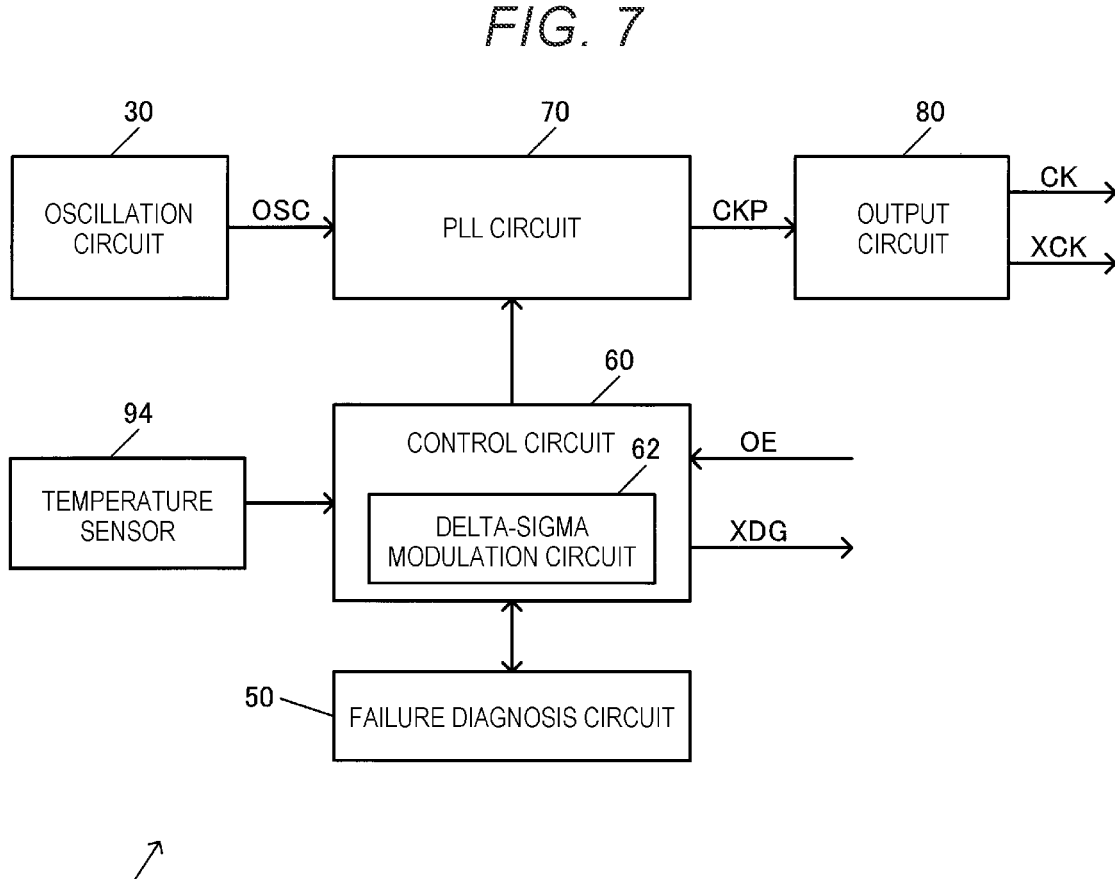
FIG. 7 is another configuration example of the circuit device.

The failure diagnosis terminal TDG is a terminal that outputs a failure diagnosis signal XDG. The failure diagnosis signal XDG is, for example, a signal indicating a result of failure diagnosis performed in the oscillator 4. For example, as shown in FIGS. 6 and 7 described later, the circuit device 20 of the oscillator 4 is provided with a failure diagnosis circuit 50, and when the failure diagnosis circuit 50 diagnoses that a failure occurred, the failure diagnosis signal XDG is output from the failure diagnosis terminal TDG. For example, the failure diagnosis signal XDG is output at an active level. The failure diagnosis can be referred to as abnormality detection. The failure diagnosis terminal and the failure diagnosis signal can be referred to as an abnormality detection terminal and an abnormality detection signal, respectively. In FIG. 1, when the failure diagnosis signal XDG output from the failure diagnosis terminal TDG is at a low level, it indicates that a failure is detected. When the failure diagnosis signal XDG is at a high level, it indicates that a failure does not occur and the oscillator 4 is operating normally.

The ground terminal TGND is a terminal to which a low-potential-side power supply voltage is supplied. The low-potential-side power supply voltage is GND, for example, is referred to as a ground voltage, and for example, is a ground potential. GND is also referred to as VSS. The power supply terminal TVDD is a terminal to which a high-potential-side power supply voltage is supplied. The high-potential-side power supply voltage is VDD, and is a high-potential voltage higher than GND. VDD is supplied from, for example, an external power supply device.

The clock terminals TCK and TXCK are terminals for outputting the clock signals CK and XCK.

Here, the differential clock signals CK and XCK are output as clock signals. For example, when the output control signal OE is at a high level, the clock signals CK and XCK are output from the clock terminals TCK and TXCK. When the output control signal OE is at a low level, the output of the clock signals CK and XCK from the clock terminals TCK and TXCK is stopped. The clock terminal may be a terminal for outputting a single-ended clock signal.

In the embodiment, the output control terminal TOE receives an output control signal having a first logic which is one of a positive logic and a negative logic. On the other hand, the failure diagnosis terminal TDG outputs a failure diagnosis signal having a second logic which is the other one of the positive logic and the negative logic. For example, in the configuration example of FIG. 1, the output control terminal TOE receives the output control signal OE having the positive logic as the first logic, and the failure diagnosis terminal TDG outputs the failure diagnosis signal XDG having the negative logic as the second logic. However, the embodiment is not limited thereto, and as shown in another configuration example of FIG. 2, the output control terminal TOE may receive an output control signal XOE having the negative logic as the first logic, and the failure diagnosis terminal TDG may output a failure diagnosis signal DG having the positive logic as the second logic. In the embodiment, "X" indicates that the signal is at the negative logic.

The positive logic signal is a signal in which the signal at the high level indicates that the signal is active. The positive logic signal indicates that, for example, the signal is inactive when the signal is at the low level. The negative logic signal is a signal in which the signal at the low level indicates that the signal is active. The negative logic signal indicates that, for example, the signal is inactive when the signal is at the high level. Active and inactive are also referred to as assert and non-assert, respectively. Non-assert is also referred to as de-assert, dessert, and negate.

For example, in the configuration example of FIG. 1, when the output control signal OE having the positive logic is at the high level, it indicates that the signal is active, and the clock signals CK and XCK are output from the oscillator 4. When the output control signal OE is at the low level, it indicates that the signal is inactive, and the output of the clock signals CK and XCK is stopped. On the other hand, when the failure diagnosis signal XDG having the negative logic is at the low level, it indicates that the signal is active and a failure is detected. When the failure diagnosis signal XDG is at the high level, it indicates that the signal is inactive, no failure is detected, and the oscillator 4 is operating normally.

On the other hand, in another configuration example of FIG. 2, when the output control signal XOE having the negative logic is at the low level, it indicates that the signal is active, and the clock signals CK and XCK are output from the oscillator 4. When the output control signal OE is at the high level, it indicates that the signal is inactive, and the output of the clock signals CK and XCK is stopped. On the other hand, when the failure diagnosis signal DG having the positive logic is at the high level, it indicates that the signal is active and a failure is detected. When the failure diagnosis signal DG is at the low level, it indicates that the signal is inactive, no failure is detected, and the oscillator 4 is operating normally.

Figure 3:
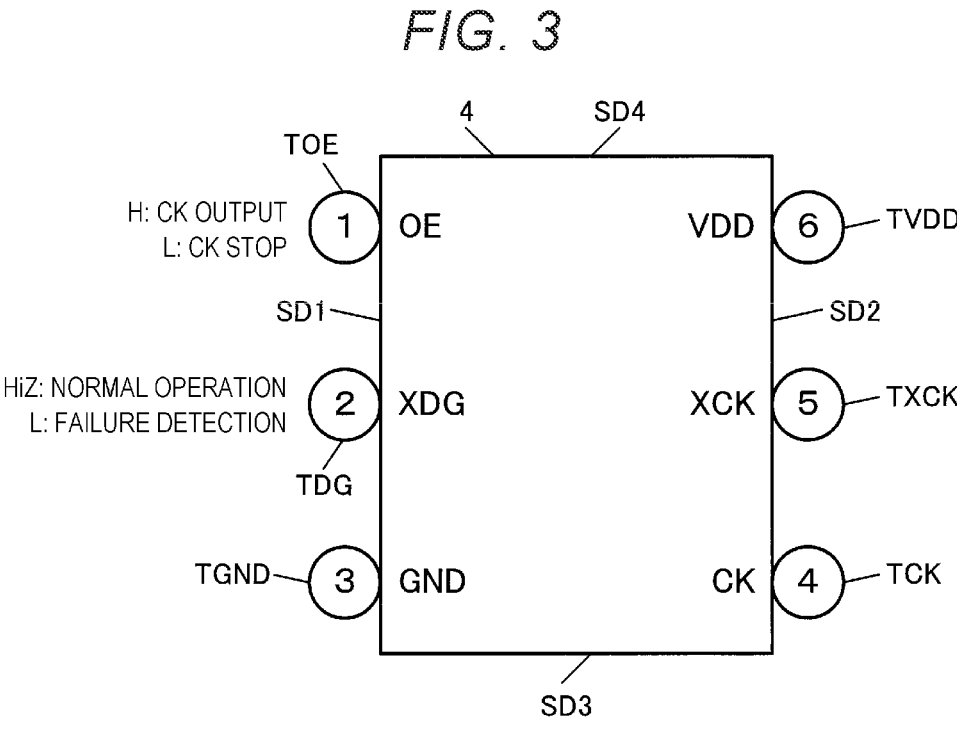
FIG. 3 is another configuration example of the oscillator according to the embodiment.
Figure 4:
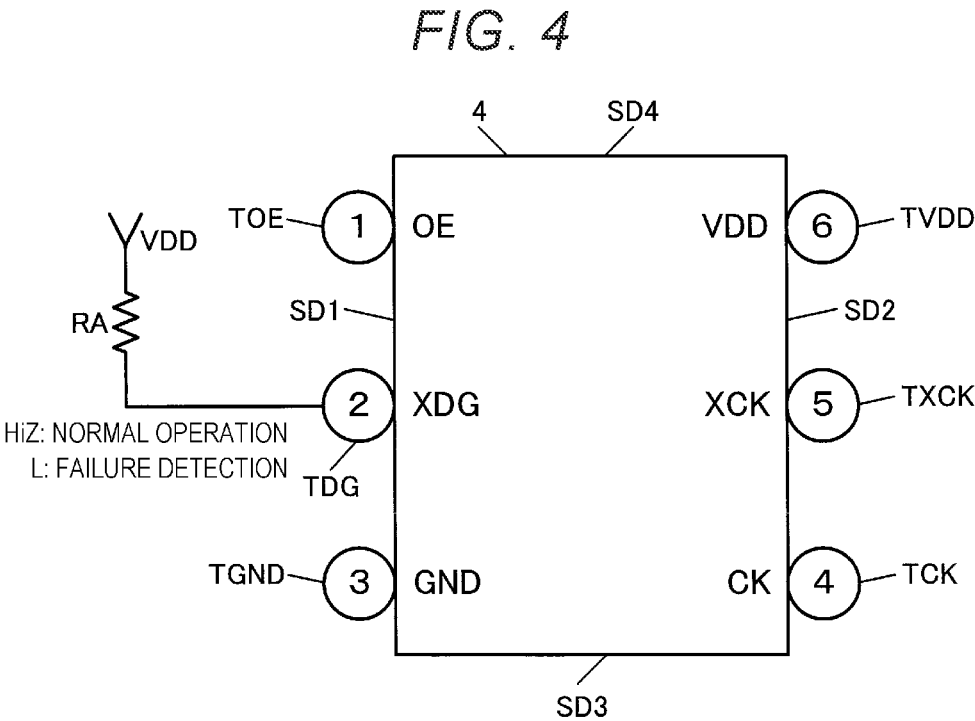
FIG. 4 is another configuration example of the oscillator according to the embodiment.

In another configuration example of FIG. 3, the output control signal is the same as that of FIG. 1, but the failure diagnosis signal XDG is different from that of FIG. 1. That is, FIG. 3 shows that a failure is detected when the failure diagnosis signal XDG having the negative logic is at the low level. On the other hand, when the failure diagnosis terminal TDG is in a high impedance state, it indicates that no failure is detected, and the oscillator 4 is operating normally. Here, the high impedance state is described as HiZ. That is, in the configuration example of FIG. 3, as shown in FIG. 4, an external pull up resistor RA is coupled to the failure diagnosis terminal TDG. Accordingly, when the failure diagnosis terminal TDG is in the high impedance state, it indicates that the failure diagnosis signal XDG is pulled up to the high level by the pull up resistor RA, no failure is detected, and the oscillator 4 is operating normally.

Hereinafter, a case in which the output control signal is a positive logic signal and the failure diagnosis signal is a negative logic signal will be mainly described as an example, and in each configuration example described below, the output control signal can be replaced with a negative logic signal and the failure diagnosis signal can be replaced with a positive logic signal. In each configuration example described below, instead of setting the failure diagnosis signal to the high level, the failure diagnosis terminal may be set to the high impedance state to pull up the failure diagnosis signal to the high level by the pull up resistor. Alternatively, instead of setting the failure diagnosis signal to be at the low level, the failure diagnosis terminal may be set to be at the high impedance state to pull down the failure diagnosis signal to the low level by a pull down resistor.

In recent years, there has been an increasing demand for reliability of the oscillator 4. For example, in applications such as in-vehicle applications, it is desirable that the oscillator 4 can perform self-failure diagnosis and output a failure diagnosis result to the outside. On the other hand, in the six-terminal oscillator 4, for example, the second terminal in FIG. 1 is a non connection (NC) terminal. For example, in the oscillator 4 of the differential clock output, two terminals are used for clock output, two terminals are used for power supply, and one terminal is used for output control, and therefore, the remaining one terminal is the NC terminal.

In this regard, in the embodiment, the second terminal which is the NC terminal is assigned to the failure diagnosis terminal TDG.

When failure diagnosis is performed in the oscillator 4 and a failure is detected, the failure diagnosis signal XDG is output from the failure diagnosis terminal TDG. Accordingly, the self-failure diagnosis of the oscillator 4 is possible, and the oscillator 4 with high reliability which is suitable for in-vehicle applications and the like can be implemented. For example, a failure occurring during the operation of the oscillator 4 can be detected in real time, and is known to the outside.

On the other hand, it is found that when such a failure diagnosis terminal TDG is provided, the following problem may occur. That is, with progress of miniaturization and high-density installation of electronic components, a risk of a short circuit failure in a circuit board of an electronic device is increasing. For example, in FIG. 5, a short circuit failure occurs in the output control terminal TOE and the failure diagnosis terminal TDG as indicated by A1. In the circuit board which is a printed board, a main cause of such a short circuit failure is adhesion of dust and the like or migration. The migration is also referred to as electrochemical migration. For example, metal ions eluted from wirings or electrodes of a circuit board due to electrical or chemical factors move between the wirings or between the electrodes, thereby causing a short circuit failure. For example, when a voltage is applied between a first wiring coupled to the output control terminal TOE and a second wiring coupled to the failure diagnosis terminal TDG, portions on anode sides of these wirings receive electrons, so that metal ions are dissolved from the surface into moisture and an ionization promoting substance contained in a board surface and a base material, move to cathode sides by Coulomb force due to an electric field, and are generated as metal again by electron exchange. Due to the ion migration, a short circuit failure occurs in the wiring coupled to the output control terminal TOE and the wiring coupled to the failure diagnosis terminal TDG. In the circuit board of the electronic device, an interval between wiring patterns is narrowed due to the miniaturization of the electronic components and a high density of the circuit, and occurrence of a short circuit failure due to a migration phenomenon of copper is increased.

When the failure diagnosis terminal TDG as in the embodiment is provided, the failure diagnosis signal for knowing the result of the failure diagnosis is generally a logical signal similar to that of the output control signal. For example, as shown in FIG. 1, when the output control signal is a positive logic signal, the failure diagnosis signal is also a positive logic signal, and the failure diagnosis signal, which is at the high level when a failure is detected and is at the low level in a normal state, is output.

However, it is found that when the output control signal is a positive logic signal, if the failure diagnosis signal is also a positive logic signal, the following problem occurs. That is, when the failure diagnosis signal is also a positive logic signal, a signal at the low level is output as the failure diagnosis signal when the oscillator 4 is in a normal state. At this time, when a short circuit failure as described with reference to FIG. 5 occurs, the output control signal also becomes at the low level due to the failure diagnosis signal at the low level, and the clock output is stopped. That is, the output control signal output from the external control device and the like is not at the low level, and the clock signals CK and XCK are not output from the oscillator 4. As shown in FIG. 2, even when the output control signal is a negative logic signal and the failure diagnosis signal having the negative logic is output, if a short circuit failure occurs, the output control signal also becomes at the high level due to the failure diagnosis signal at the high level, and the clock output is stopped.

In the oscillator 4 according to the embodiment, the output control terminal TOE receives the output control signal having the first logic which is one of the positive logic and the negative logic, and the failure diagnosis terminal TDG outputs the failure diagnosis signal having the second logic which is the other one of the positive logic and the negative logic. Thus, when the output control signal is a positive logic signal, the failure diagnosis signal is a negative logic signal, and when the output control signal is a negative logic signal, the failure diagnosis signal is a positive logic signal. Therefore, even when a short circuit failure occurs between the wiring of the output control signal and the wiring of the failure diagnosis signal, it is possible to prevent the clock signals CK and XCK from being stopped. Accordingly, the failure diagnosis of the oscillator 4 can be implemented, and the occurrence of the problem such as the stop of the clock output due to the short circuit failure and the like can be prevented.

For example, in the case of FIGS. 1 and 3, the output control signal OE having the positive logic is input to the output control terminal TOE, and the failure diagnosis signal XDG having the negative logic is output from the failure diagnosis terminal TDG. Accordingly, when the output control signal OE is at the high level and the oscillator 4 normally operates to output the clock signals CK and XCK, the failure diagnosis signal XDG is at the high level in the case of FIG. 1, and the failure diagnosis terminal TDG is in the high impedance state in the case of FIG. 3. Accordingly, even when a short circuit failure occurs between a wiring of the output control signal OE and a wiring of the failure diagnosis signal XDG, the output control signal OE is maintained at the high level, and thus it is possible to prevent the clock signals CK and XCK from being stopped. Even when a short circuit failure occurs when a failure of the oscillator 4 is detected and the failure diagnosis signal XDG is at the low level, there is no problem only because the output control signal OE is at the low level and the clock output is stopped. In the case of FIG. 2, the output control signal XOE having the negative logic is input to the output control terminal TOE, and the failure diagnosis signal DG having the positive logic is output from the failure diagnosis terminal TDG. Accordingly, when the output control signal XOE is at the low level and the oscillator 4 normally operates to output the clock signals CK and XCK, the failure diagnosis signal DG is at the low level. Accordingly, even when a short circuit failure occurs between the output control signal XOE and the failure diagnosis signal DG, the output control signal XOE is maintained at the low level, and thus it is possible to prevent the clock signals CK and XCK from being stopped. Accordingly, by providing the failure diagnosis terminal TDG in the oscillator 4, the self-failure diagnosis is possible, the stop of the clock output due to the short circuit failure can be prevented, and the reliability of the oscillator 4 can be greatly improved.

In the embodiment, the clock terminals TCK and TXCK output the clock signals CK and XCK when the output control signal at a first level which is one of the high level and the low level is input to the output control terminal TOE, and do not output the clock signals CK and XCK when the output control signal at a second level which is the other one of the high level and the low level is input to the output control terminal TOE. The failure diagnosis terminal TDG outputs the failure diagnosis signal at the first level or is set to the high impedance state when operating normally, and outputs the failure diagnosis signal at the second level when a failure is detected. Thus, when the output control signal at the first level is input to the output control terminal TOE and the oscillator 4 normally operates to output the clock signals CK and XCK, the failure diagnosis terminal TDG outputs the failure diagnosis signal at the same first level, or the failure diagnosis terminal TDG is set to the high impedance state. Accordingly, even when a short circuit failure occurs, the output control signal is maintained at the first level, and thus it is possible to prevent the clock output from being stopped.

For example, in the cases of FIGS. 1 and 3, the first level and the second level are a high level and a low level, respectively. The clock terminals TCK and TXCK output the clock signals CK and XCK when the output control signal OE at the high level, which is the first level, is input to the output control terminal TOE, and do not output the clock signals CK and XCK when the output control signal OE at the low level, which is the second level, is input to the output control terminal TOE. The failure diagnosis terminal TDG outputs the failure diagnosis signal XDG at the high level, which is the first level, as shown in FIG. 1 during the normal operation, or is set to the high impedance state as shown in FIG. 3, and outputs the failure diagnosis signal XDG at the low level which is the second level when a failure is detected. Thus, when the output control signal OE at the high level is input to the output control terminal TOE and the oscillator 4 normally operates to output the clock signals CK and XCK, the failure diagnosis terminal TDG outputs the failure diagnosis signal XDG at the same high level as shown in FIG. 1, or the failure diagnosis terminal TDG is set to be at the high impedance state as shown in FIG. 3. Accordingly, even when a short circuit failure occurs, the output control signal OE is maintained at the high level, and thus it is possible to prevent the clock output from being stopped.

In the case of FIG. 2, the first level and the second level are a low level and a high level, respectively. The clock terminals TCK and TXCK output the clock signals CK and XCK when the output control signal XOE at the low level, which is the first level, is input to the output control terminal TOE, and do not output the clock signals CK and XCK when the output control signal XOE at the high level, which is the second level, is input to the output control terminal TOE. The failure diagnosis terminal TDG outputs the failure diagnosis signal DG at the low level which is the first level during the normal operation, and outputs the failure diagnosis signal DG at the high level which is the second level when a failure is detected. Thus, when the output control signal OE at the low level is input to the output control terminal TOE and the oscillator 4 normally operates to output the clock signals CK and XCK, the failure diagnosis terminal TDG outputs the failure diagnosis signal DG at the same low level. Accordingly, even when a short circuit failure occurs, the output control signal XOE is maintained at the low level, and thus it is possible to prevent the clock output from being stopped.

As shown in FIGS. 1 to 4, in the oscillator 4 according to the embodiment, the output control terminal TOE and the failure diagnosis terminal TDG are arranged side by side. For example, the output control terminal TOE and the failure diagnosis terminal TDG are arranged side by side in a plan view in a direction orthogonal to the main surface of the package 15 of the oscillator 4 in FIGS. 12 and 13. For example, the output control terminal TOE and the failure diagnosis terminal TDG are arranged adjacent to each other without a terminal interposed therebetween. For example, when the output control terminal TOE is an n-th terminal, the failure diagnosis terminal TDG is an (n+1)-th terminal and is an adjacent terminal. Thus, for example, when a terminal adjacent to the output control terminal TOE is, for example, the NC terminal, the NC terminal can be assigned to the failure diagnosis terminal TDG to output the failure diagnosis signal XDG. When the output control terminal TOE and the failure diagnosis terminal TDG are arranged side by side as described above, the problem of the short circuit failure described above is likely to occur. However, according to the embodiment, even when such a short circuit failure occurs, it is possible to prevent occurrence of a problem such as the stop of the clock output.

As shown in FIGS. 1 to 4, in the oscillator 4 according to the embodiment, the output control terminal TOE and the failure diagnosis terminal TDG are arranged side by side along a first side SD1 of the oscillator 4. For example, the oscillator 4 has the first side SD1 and a second side SD2 which is an opposite side of the first side SD1. The oscillator 4 has a third side SD3 and a fourth side SD4 orthogonal to the first side SD1 and the second side SD2. The fourth side SD4 is an opposite side of the third side SD3. The first side SD1 to the fourth side SD4 are, for example, sides of the package 15 in a plan view orthogonal to the main surface of the package 15 of the oscillator 4. The output control terminal TOE and the failure diagnosis terminal TDG are arranged side by side along the first side SD1 which is one side of the oscillator 4. Although a plurality of terminals such as the output control terminal TOE and the failure diagnosis terminal TDG are schematically shown in FIGS. 1 to 4, actually, for example, the plurality of terminals can be arranged on a bottom surface of a base 16 of the package 15 of the oscillator 4 as shown in FIGS. 12 and 13. When the output control terminal TOE and the failure diagnosis terminal TDG are disposed along the first side SD1 of the oscillator 4 as described above, the problem of the short circuit failure described above is likely to occur. However, according to the embodiment, even when such a short circuit failure occurs, it is possible to prevent a problem such as the stop of the clock output. For example, a modification is also possible in which the failure diagnosis terminal TDG and the output control terminal TOE are disposed, such that a corner portion of the oscillator 4 is sandwiched therebetween. For example, a modification is also possible in which the failure diagnosis terminal TDG is disposed near the corner portion on the first side SD1, and the output control terminal TOE is disposed near the corner portion on the fourth side SD4 intersecting the first side SD1.

As shown in FIGS. 1 to 4, in the embodiment, the positive side clock terminal TCK that outputs the positive side clock signal CK of a differential clock signal and the negative side clock terminal TXCK that outputs the negative side clock signal XCK of the differential clock signal are provided as the clock terminals. The output control terminal TOE, the failure diagnosis terminal TDG, and the ground terminal TGND are arranged in an order of TOE, TDG, and TGND along the first side SD1 of the oscillator 4. The power supply terminal TVDD, the negative side clock terminal TXCK, and the positive side clock terminal TCK are arranged in an order of TVDD, TXCK, and TCK along the second side SD2 which is the opposite side of the first side SD1 of the oscillator 4. Thus, in the differential output type six-terminal oscillator 4 that outputs the differential clock signal, the failure diagnosis terminal TDG can be provided to output the failure diagnosis signal XDG. For example, the failure diagnosis terminal TDG can be provided in a terminal arrangement serving as a de facto standard of the differential output type six-terminal oscillator 4. For example, the failure diagnosis terminal TDG can be provided by effectively utilizing the second terminal which is the NC terminal between the output control terminal TOE which is the first terminal and the ground terminal TGND which is the third terminal along the first side SD1. In this case, the output control terminal TOE which is the first terminal and the failure diagnosis terminal TDG which is the second terminal are adjacent to each other. Even when a short circuit failure occurs between the terminals, it is possible to prevent occurrence of a malfunction such as the stop of the clock output.

2. Circuit Device

FIG. 6 shows a configuration example of the circuit device 20 provided in the oscillator 4 according to the embodiment. As shown in FIG. 6, the oscillator 4 according to the embodiment includes the resonator 10 and the circuit device 20. The resonator 10 is electrically coupled to the circuit device 20. For example, the resonator 10 and the circuit device 20 are electrically coupled by using an internal wiring, a bonding wire, or a metal bump of a package that accommodates the resonator 10 and the circuit device 20. The circuit device 20 and the oscillator 4 are not limited to the configuration in FIG. 2, and various modifications can be made, such as omitting a part of components, adding other components, or replacing a part of components with other components.

The resonator 10 is an element that generates mechanical resonance by an electric signal. The resonator 10 can be implemented by a resonator element such as a quartz crystal resonator element. For example, the resonator 10 can be implemented by a quartz crystal resonator element that has a cut angle of AT cut or SC cut and performs thickness-shear vibration, a tuning fork type quartz crystal resonator element, or a double tuning fork type quartz crystal resonator element. For example, the resonator 10 may be a resonator in a temperature compensated crystal oscillator (TCXO) including no thermostatic oven or may be a resonator in an oven-controlled crystal oscillator (OCXO) including a thermostatic oven. The resonator 10 according to the embodiment can also be implemented by various resonator elements such as a resonator element other than a thickness-shear vibrating type, a tuning fork type or a double tuning fork type, or a piezoelectric resonator element made of a material other than quartz crystal. For example, a surface acoustic wave (SAW) resonator, or a micro electro mechanical systems (MEMS) resonator as a silicon resonator formed using a silicon substrate may be adopted as the resonator 10.

The circuit device 20 is an integrated circuit device referred to as an integrated circuit (IC). For example, the circuit device 20 is an IC manufactured by a semiconductor process and is a semiconductor chip in which a circuit element is formed on a semiconductor substrate. The circuit device 20 includes an oscillation circuit 30, the failure diagnosis circuit 50, a control circuit 60, and an output circuit 80. The circuit device 20 can include a power supply circuit 90, a nonvolatile memory 92, and a temperature sensor 94.

The circuit device 20 includes pads PVDD, PGND, PX1, PX2, PCK, PXCK, POE, and PDG. The pads are terminals of the circuit device 20 which is a semiconductor chip. For example, in a pad area, a metal layer is exposed from a passivation film that is an insulating layer, and the exposed metal layer constitutes a pad that is a terminal of the circuit device 20. The pads PVDD and PGND are a power supply pad and a ground pad, respectively. The power supply voltage VDD from an external power supply device is supplied to the pad PVDD. The pad PGND is a pad to which GND, which is a ground voltage, is supplied. GND can also be referred to as VSS. For example, VDD corresponds to the high-potential-side power supply voltage, and GND corresponds to the low-potential-side power supply voltage. The pads PX1 and PX2 are pads for coupling to the resonator 10. The pads PCK and PXCK are pads for outputting the clock signals CK and XCK. The pad POE is a pad for inputting the output control signal OE, and the pad PDG is a pad for outputting the failure diagnosis signal XDG. The respective pads of PVDD, PGND, PCK, PXCK, POE, and PDG are electrically coupled to respective terminals of TVDD, TGND, TCK, TXCK, TOE, and TDG for external coupling of the oscillator 4. For example, each pad and each terminal are electrically coupled by using an internal wiring, a bonding wire, or a metal bump of a package.

The oscillation circuit 30 is a circuit that oscillates the resonator 10. For example, the oscillation circuit 30 outputs an oscillation clock signal OSC by oscillating the resonator 10. For example, the oscillation circuit 30 can be implemented by an oscillation drive circuit electrically coupled to one end and the other end of the resonator 10 and a passive element such as a capacitor or a resistor. The drive circuit can be implemented by, for example, a CMOS inverter circuit or a bipolar transistor. The drive circuit is a core circuit of the oscillation circuit 30. The drive circuit drives the resonator 10 by a voltage or a current to oscillate the resonator 10. As the oscillation circuit 30, various types of oscillation circuits such as an inverter type, a Pierce type, a Colpitts type, or a Hartley type can be used. The oscillation circuit 30 may generate an oscillation signal by using an element other than the resonator 10. The oscillation circuit 30 is provided with a variable capacitance circuit, and an oscillation frequency can be adjusted by adjusting a capacitance of the variable capacitance circuit. The variable capacitance circuit can be implemented by a variable capacitance element such as a varactor.

For example, the variable capacitance circuit can be implemented by the variable capacitance element whose capacitance is controlled based on a temperature compensation voltage. Alternatively, the variable capacitance circuit may be implemented by a capacitor array and a switch array coupled to the capacitor array. The coupling in the embodiment is electrical coupling. The electrical coupling is coupling through which an electrical signal can be transmitted and coupling through which information can be transmitted by the electrical signal. The electrical coupling may be coupling via a passive element and the like.

The failure diagnosis circuit 50 is a circuit that performs failure diagnosis of the oscillator 4. Details of the failure diagnosis circuit 50 will be described later.

The control circuit 60 is, for example, a logic circuit and performs various control processes. For example, the control circuit 60 controls the entire circuit device 20 or controls an operation sequence of the circuit device 20. For example, the control circuit 60 controls each circuit block of the circuit device 20 such as the oscillation circuit 30, the output circuit 80, and the nonvolatile memory 92. The control circuit 60 can be implemented by a circuit of an application specific integrated circuit (ASIC) based on an automatic arrangement wiring such as a gate array.

The output circuit 80 outputs the clock signals CK and XCK based on the oscillation clock signal OSC from the oscillation circuit 30. For example, the output circuit 80 buffers the oscillation clock signal OSC from the oscillation circuit 30, and outputs the oscillation clock signal OSC as the clock signals CK and XCK to the pads PCK and PXCK. The clock signals CK and XCK are output to the outside via the clock terminals TCK and TXCK of the oscillator 4. Specifically, the output circuit 80 outputs the differential clock signals CK and XCK to the outside in a signal format such as low voltage differential signaling (LVDS), positive emitter coupled logic (PECL), high speed current steering logic (HCSL), or differential complementary MOS (CMOS). The output circuit 80 may output a clock signal in a single-ended CMOS signal format.

The power supply circuit 90 is supplied with the power supply voltage VDD from the pad PVDD and the ground voltage GND from the pad PGND, and supplies various power supply voltages for an internal circuit of the circuit device 20 to the internal circuit. For example, the power supply circuit 90 supplies a regulated power supply voltage obtained by regulating the power supply voltage VDD to each circuit of the circuit device 20 such as the oscillation circuit 30.

The nonvolatile memory 92 is a memory that stores information without power supply. For example, the non-volatile memory 92 is a memory that can hold information without power supply, and can rewrite information. The nonvolatile memory 92 stores various types of information necessary for the operation and the like of the circuit device 20. The nonvolatile memory 92 can be implemented by an electrically erasable programmable read-only memory (EE-PROM) and the like implemented by a floating gate ava-lanche injection MOS memory (FAMOS memory) or a metal-oxide-nitride-oxide-silicon memory (MONOS memory).

The temperature sensor 94 is a sensor that detects a temperature and outputs a temperature detection signal. Specifically, the temperature sensor 94 outputs, as the tem-perature detection signal, a temperature detection voltage that changes according to a temperature of the environment. For example, the temperature sensor 94 generates the tem-perature detection signal using a circuit element having temperature dependence. Specifically, the temperature sen-sor 94 outputs the temperature detection voltage whose voltage changes depending on the temperature by using, for example, temperature dependence of a forward voltage of PN junction.

A modification using a digital temperature sensor circuit as the temperature sensor 94 is also possible. In this case, for example, temperature detection data is output as the tem-perature detection signal.

In the embodiment, temperature compensation of an oscillation frequency of the oscillation circuit 30 may be performed. The temperature compensation of the oscillation frequency is temperature compensation of the oscillation signal of the oscillation circuit 30, and is temperature compensation of the clock signals CK and XCK. The temperature compensation is performed based on, for example, the temperature detection signal from the tempera-ture sensor 94. For example, a temperature compensation voltage is generated based on the temperature detection voltage from the temperature sensor 94, and the generated temperature compensation voltage is input to the oscillation circuit 30, thereby performing the temperature compensa-tion. Specifically, for the variable capacitance circuit pro-vided in the oscillation circuit 30, the temperature compen-sation is performed by inputting the temperature compensation voltage serving as a capacitance control volt-age of the variable capacitance circuit. In this case, the variable capacitance circuit of the oscillation circuit 30 is implemented by a variable capacitance element such as a varactor. As the temperature compensation, analog tempera-ture compensation is performed by polynomial approxima-tion. For example, when the temperature compensation voltage for compensating frequency-temperature character-istics of the resonator 10 is approximated by the polynomial, the analog temperature compensation is performed based on coefficient information of the polynomial. Correction data for the temperature compensation, which is the coefficient information of the polynomial, is stored in the nonvolatile memory 92. Alternatively, as the temperature compensation, digital temperature compensation may be performed. For example, frequency adjustment data is obtained based on the temperature detection data from the temperature sensor 94. The frequency adjustment data is a frequency adjustment code. A capacitance value of the variable capacitance circuit of the oscillation circuit 30 is adjusted based on the obtained frequency adjustment data, thereby implementing the digital temperature compensation. In this case, the variable capaci-tance circuit of the oscillation circuit 30 is implemented by the capacitor array having a plurality of binary-weighted capacitors and the switch array.

As described above, the oscillator 4 according to the embodiment includes the resonator 10 and the circuit device 20. The circuit device 20 includes the oscillation circuit 30, the output circuit 80, the control circuit 60, and the failure diagnosis circuit 50. The oscillation circuit 30 oscillates the resonator 10. For example, the oscillation circuit 30 outputs the oscillation clock signal OSC by oscillating the resonator 10. The output circuit 80 outputs, to the clock terminals TCK and TXCK, the clock signals CK and XCK based on the oscillation clock signal OSC from the oscillation circuit 30. For example, the output circuit 80 buffers the oscillation clock signal OSC to output as the clock signals CK and XCK, or buffers a signal obtained by multiplying a fre-quency of the oscillation clock signal OSC by a PLL circuit and the like to output the signal as the clock signals CK and XCK. The output control signal OE is input to the control circuit 60. For example, the control circuit 60 controls the output circuit 80 based on the output control signal OE to control the enabling and disenabling of the output of the clock signals CK and XCK. The failure diagnosis circuit 50 performs failure diagnosis for generating the failure diag-nosis signal XDG. For example, the control circuit 60 outputs, to the failure diagnosis terminal TDG, the failure diagnosis signal XDG based on a failure diagnosis result of the failure diagnosis circuit 50. Thus, the clock signals CK and XCK generated by causing the oscillation circuit 30 to oscillate the resonator 10 can be output from the clock terminals TCK and TXCK by the output circuit 80. By inputting the output control signal OE to the control circuit 60 via the output control terminal TOE, output control of the clock signals CK and XCK can be performed. The failure diagnosis signal XDG based on the failure diagnosis of the failure diagnosis circuit 50 is output via the failure diagnosis terminal TDG, so that the result of the failure diagnosis of the oscillator 4 can be transmitted to the outside.

For example, in FIG. 6, the failure diagnosis circuit 50 performs monitoring of the oscillation signal of the oscilla-tion circuit 30 as the failure diagnosis. For example, the failure diagnosis circuit 50 monitors whether the oscillation signal of the oscillation circuit 30 is in an appropriate signal state. Specifically, the monitoring of the oscillation signal is implemented by monitoring a waveform and an amplitude of the oscillation signal. When the failure diagnosis circuit 50 determines that the oscillation signal is not in the appropriate signal state based on a monitoring result of the oscillation signal, for example, the failure diagnosis signal XDG at an active level is output from the failure diagnosis terminal TDG via, for example, the control circuit 60. In the case of the failure diagnosis signal XDG having the negative logic, the active level is a low level.

Various types of diagnosis are conceivable as the failure diagnosis of the failure diagnosis circuit 50. For example, FIG. 7 shows another configuration example of the circuit device 20. In the circuit device 20 of FIG. 7, a PLL circuit 70 is further provided, and the oscillation clock signal OSC from the oscillation circuit 30 is input to the PLL circuit 70 as a reference clock signal. The PLL circuit 70 generates a clock signal CKP having a frequency obtained by multiplying a frequency of the reference clock signal. The output circuit 80 buffers the clock signal CKP from the PLL circuit 70 and outputs the clock signals CK and XCK. The PLL circuit 70 includes, for example, a phase comparison circuit, a charge pump circuit, a voltage-controlled oscillation circuit, and a frequency division circuit (not shown).

The control circuit 60 is provided with a delta-sigma modulation circuit 62, and the PLL circuit 70 operates as a fractional-N type PLL circuit by performing delta-sigma modulation by the delta-sigma modulation circuit 62. Thus, not only an integer but also a fraction can be set as a frequency division ratio of the PLL circuit 70, and the clock signals CK and XCK having any frequency can be generated.

Specifically, the control circuit 60 performs a temperature compensation process based on the temperature detection data from the temperature sensor 94 and a frequency division ratio setting value for setting the frequency division ratio of the PLL circuit 70. The delta-sigma modulation circuit 62 performs a delta-sigma modulation calculation process on a calculation value after the temperature compensation process, and outputs a frequency division ratio setting signal for setting the frequency division ratio of the frequency division circuit (not shown) provided in the PLL circuit 70. The frequency division circuit and the delta-sigma modulation circuit 62 constitute a fractional divider. The fractional divider divides the clock signal CKP using a reciprocal of a multiplication factor of the PLL circuit 70 as the frequency division ratio, and outputs the divided clock signal as a feedback clock signal to the phase comparison circuit (not shown) of the PLL circuit. The delta-sigma modulation circuit 62 performs delta-sigma modulation on a value of a fractional part of the frequency division ratio to generate a modulation value that is an integer. For example, the delta-sigma modulation circuit 62 performs a third-order or fourth-order delta-sigma modulation process. An addition value of a value of an integer part the frequency division ratio and the modulation value is set as the frequency division ratio setting signal in the frequency division circuit of the PLL circuit 70. Accordingly, the fractional-N type PLL circuit 70 is implemented.

The failure diagnosis circuit 50 performs, as the failure diagnosis, the monitoring of the calculation process such as a delta-sigma modulation process in the control circuit 60. For example, the failure diagnosis circuit 50 monitors whether the delta-sigma modulation process of the delta-sigma modulation circuit 62 is appropriately performed. When the failure diagnosis circuit 50 determines, based on the monitoring result, that the appropriate calculation process is not performed, the failure diagnosis signal XDG at the active level such as a low level is output from the failure diagnosis terminal TDG via, for example, the control circuit 60.

The failure diagnosis performed by the failure diagnosis circuit 50 is not limited to the above-described process. For example, the failure diagnosis circuit 50 may perform failure diagnosis of the control circuit 60, the output circuit 80, the power supply circuit 90, the nonvolatile memory 92, or the temperature sensor 94. For example, the failure diagnosis circuit 50 performs failure diagnosis of the calculation process by the logic circuit of the control circuit 60. In addition, the failure diagnosis circuit 50 performs failure diagnosis of a voltage generation circuit provided in the power supply circuit 90. In addition, the failure diagnosis circuit 50 performs failure diagnosis of a memory cell, a read circuit, or a write circuit of the nonvolatile memory 92. In addition, the failure diagnosis circuit 50 performs failure diagnosis of a circuit of the temperature sensor 94 that generates the temperature detection signal. Various processes can be assumed as the failure diagnosis performed by the failure diagnosis circuit 50.

3. Serial Communication

Figure 8:
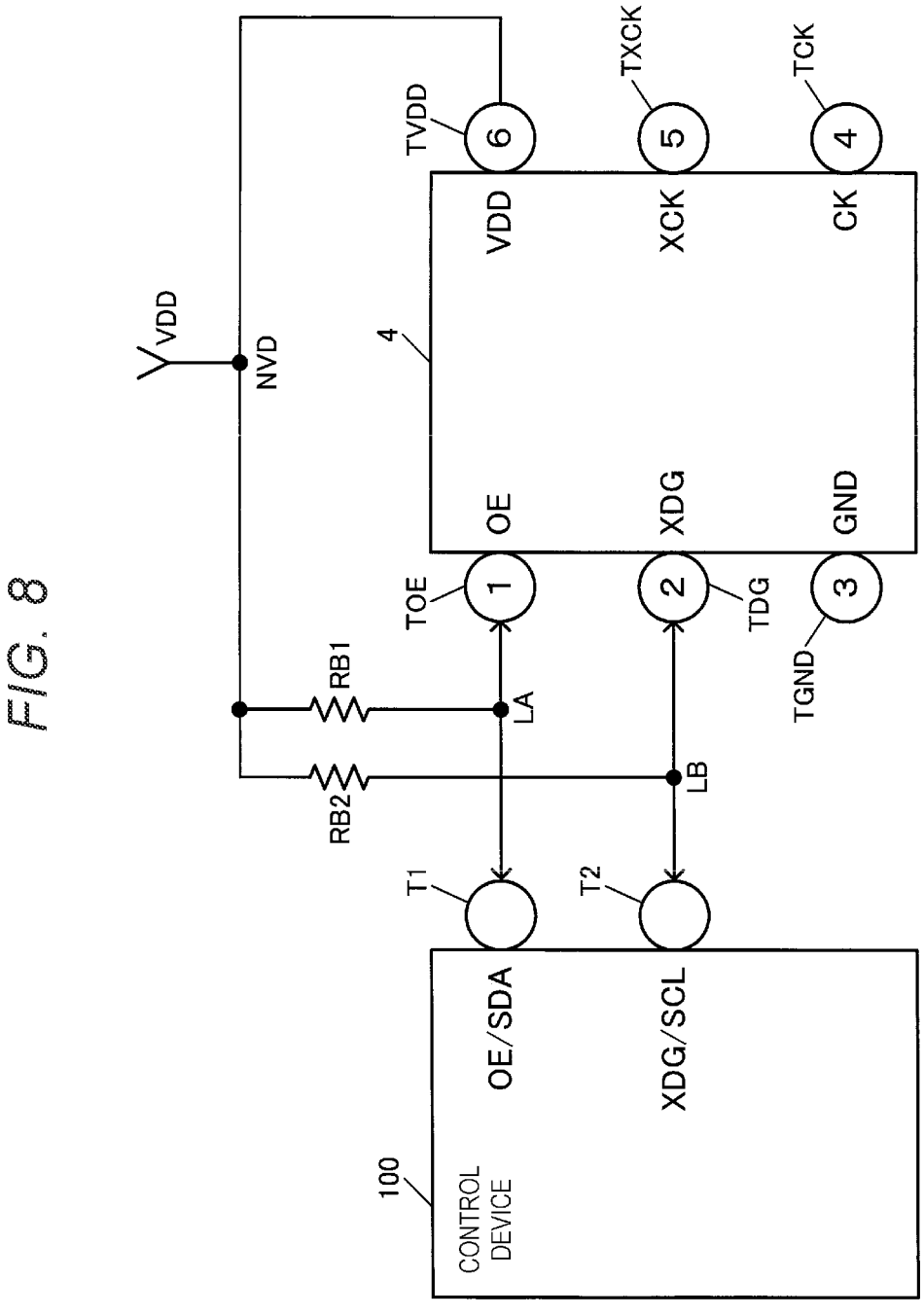
FIG. 8 is a diagram of shared use with a terminal for serial communication.

In the embodiment, the failure diagnosis terminal TDG and the output control terminal TOE can be used both as an input terminal for a serial clock signal and an input and output terminal for a serial data signal for the serial communication. FIG. 8 shows a configuration example and a coupling example of the oscillator 4 in this case. In FIG. 8, the output control terminal TOE of the oscillator 4 is electrically coupled to a first terminal T1 of an external control device 100. For example, the output control terminal TOE and the first terminal T1 are coupled to each other by a wiring LA on a circuit board to which the oscillator 4 and the control device 100 are provided. The failure diagnosis terminal TDG of the oscillator 4 is electrically coupled to a second terminal T2 of the control device 100. For example, the failure diagnosis terminal TDG and the second terminal T2 are coupled to each other by a wiring LB on the circuit board. The wiring LA coupling the output control terminal TOE and the first terminal T1 is coupled to one end of a first resistor RB1 whose other end is coupled to a power supply node NVD of VDD. The wiring LB coupling the failure diagnosis terminal TDG and the second terminal T2 is coupled to one end of a second resistor RB2 whose other end is coupled to the power supply node NVD of VDD.

In a normal operation, the control device 100 outputs the output control signal OE from the first terminal T1, and the output control signal OE is input to the output control terminal TOE of the oscillator 4, thereby controlling the clock output. In the normal operation, the oscillator 4 outputs the failure diagnosis signal XDG from the failure diagnosis terminal TDG, and the failure diagnosis signal XDG is input to the second terminal T2 of the control device 100. Therefore, the result of the failure diagnosis can be transmitted to the control device 100.

On the other hand, in a serial communication mode, the first terminal T1 of the control device 100 and the output control terminal TOE of the oscillator 4 are terminals to which serial data SDA is input or output. In the serial communication mode, the second terminal T2 of the control device 100 serves as an output terminal of a serial clock signal SCL, and the failure diagnosis terminal TDG of the oscillator 4 serves as an input terminal of the serial clock signal SCL. The serial communication here is, for example, inter-integrated circuit (I2C) serial communication, but is not limited thereto. For example, serial communication in which the I2C is developed or serial communication of two lines in a standard different from that of the I2C may be used.

Figure 9:
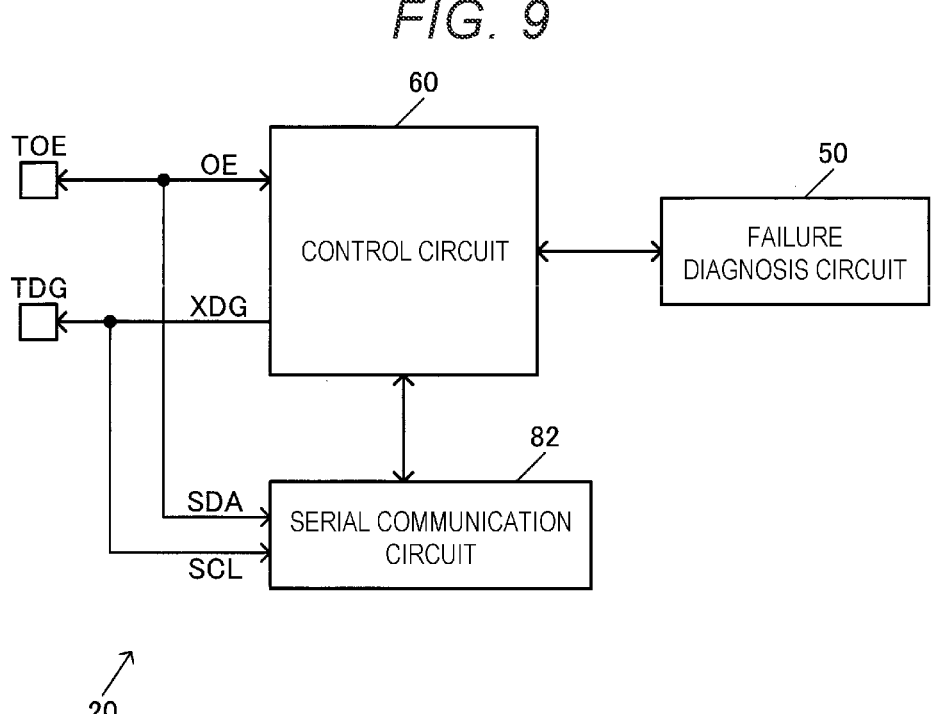
FIG. 9 is a configuration example of the circuit device provided with a serial communication circuit.

FIG. 9 shows a configuration example of the circuit device 20 according to the embodiment when such serial communication is performed. As shown in FIG. 9, the circuit device 20 includes a serial communication circuit 82. The serial communication circuit 82 is a circuit that performs serial communication conforming to an interface standard of the I2C and the like.

As described in FIG. 8, in the serial communication mode in which the serial communication is performed by the serial communication circuit 82, the serial clock signal SCL is input to the failure diagnosis terminal TDG. For example, the serial clock signal SCL output from the control device 100 is input to the serial communication circuit 82 via the failure diagnosis terminal TDG. In the serial communication mode, the serial data SDA is input or output via the output control terminal TOE. For example, the serial data SDA output by the control device 100 is input to the serial communication circuit 82 via the output control terminal TOE, and serial data DA output by the serial communication circuit 82 is output to the control device 100 via the output control terminal TOE. Thus, the failure diagnosis terminal TDG and the output control terminal TOE can be used both as a terminal for inputting the serial clock signal SCL and a terminal for inputting and outputting the serial data SDA for the serial communication. When a failure occurs and the failure diagnosis signal XDG becomes active, for example, detailed contents of the failure can be transmitted to the outside through the serial communication by the serial communication circuit 82. Alternatively, the control device 100 can perform various settings of the oscillator 4 through the serial communication by the serial communication circuit 82.

Next, an operation example of the embodiment in FIGS. 8 and 9 will be described. First, a first operation example will be described. In the first operation example, in a normal operation mode, TOE and TDG are assigned to the output control terminal and the failure diagnosis terminal, respectively. Then, the failure diagnosis circuit 50 performs self-failure diagnosis for detecting an abnormality of the oscillator 4. The abnormality of the oscillator 4 is, for example, an abnormality of the oscillation circuit 30 and the like. When an abnormality is detected, for example, the failure diagnosis signal XDG at the low level is output from the failure diagnosis terminal TDG. Thus, the control device 100 such as a microcontroller that monitors the failure diagnosis signal XDG outputs, to the output control terminal TOE, a pulse train for switching to the serial communication mode. Accordingly, the oscillator 4 is switched from the normal operation mode to the serial communication mode, and TOE and TDG are assigned to the terminal for the serial data and the terminal for the serial clock signal, respectively. The serial communication mode is, for example, an I2C interface mode. Then, the control device 100 determines what kind of abnormality is detected by reading contents of a register (not shown) provided in the circuit device 20 by an interface process by the serial communication, and executes a process corresponding to the detected abnormality. For example, in a case of an in-vehicle device, when the detected abnormality is a warning, a process for displaying a warning light requesting maintenance is performed. In addition, when the detected abnormality is an error, a process for appropriately stopping an application such as reducing a speed of a vehicle or stopping a heater is performed.

Next, a second operation example will be described. In the second operation example, in the normal operation mode, TOE and TDG also are assigned to the output control terminal and the failure diagnosis terminal, respectively. In the oscillator 4 including the PLL circuit 70 as shown in FIG. 7, in order to switch a clock frequency, the control device 100 outputs, to the output control terminal TOE, a pulse train for switching to the serial communication mode. Accordingly, the oscillator 4 is switched from the normal operation mode to the serial communication mode, and TOE and TDG are assigned to the terminal for the serial data and the terminal for the serial clock signal, respectively. Then, the control device 100 changes contents of a register for setting a multiplier of the PLL circuit 70 by the interface process by the serial communication.

It is assumed that the failure diagnosis circuit 50 detects an abnormality of the oscillator 4 in such a serial communication period. Thus, when the abnormality of the oscillator 4 is detected, the oscillator 4 is switched from the serial communication mode to the normal operation mode, and TOE and TDG are assigned to the output control terminal and the failure diagnosis terminal, respectively. For example, the failure diagnosis signal XDG at the low level is output from the failure diagnosis terminal TDG.

At this time, the control device 100 operates as a master in the I2C. Therefore, the control device 100 generally does not detect that the oscillator 4, which is a slave or target of the I2C, originally outputs the low level from the terminal TDG, which is the input terminal of the serial clock signal SCL. However, when performing the subsequent I2C communication, the control device 100 as the master can detect that a line of the serial clock signal SCL that is to be at a high level due to the second resistor RB2 for pull up in FIG. 8 is in a clock stretch state in which the line does not become at a high level. That is, a master of a general I2C has a detection function of the clock stretch, and the clock stretch state can be detected by the detection function. For example, the clock stretch in the I2C is a function in which the slave forcibly sets the line of the serial clock signal SCL to a low level and causes a clock transmission from the master side to wait, for example, when the slave cannot perform a process in time in response to a command from the master. Then, upon detecting the clock stretch, the control device 100 outputs, to the output control terminal TOE, the pulse train for switching to the serial communication mode, and switches the oscillator 4 from the normal operation mode to the serial communication mode. Then, as in the first operation example described above, the control device 100 determines what kind of abnormality is detected by reading the contents of the register provided in the circuit device 20 by the interface process by the serial communication, and executes the process corresponding to the detected abnormality.

As described above, the serial communication by the serial communication circuit 82 according to the embodiment is communication of a standard detected as a clock stretch when the serial clock signal SCL is at a low level for a given period. Communication of such a standard includes I2C communication and communication of a standard in which the I2C is developed. Thus, when the failure of the oscillator 4 is detected in the serial communication mode, the oscillator 4 is switched from the serial communication mode to the normal operation mode and the failure diagnosis signal XDG at the low level is output from the failure diagnosis terminal TDG, the external control device 100 can detect the state of the low level as the clock stretch. Accordingly, for example, the control device 100 can switch the oscillator 4 from the normal operation mode to the serial communication mode, and read information on failure contents of the oscillator 4.

4. Electronic Device

Figure 10:
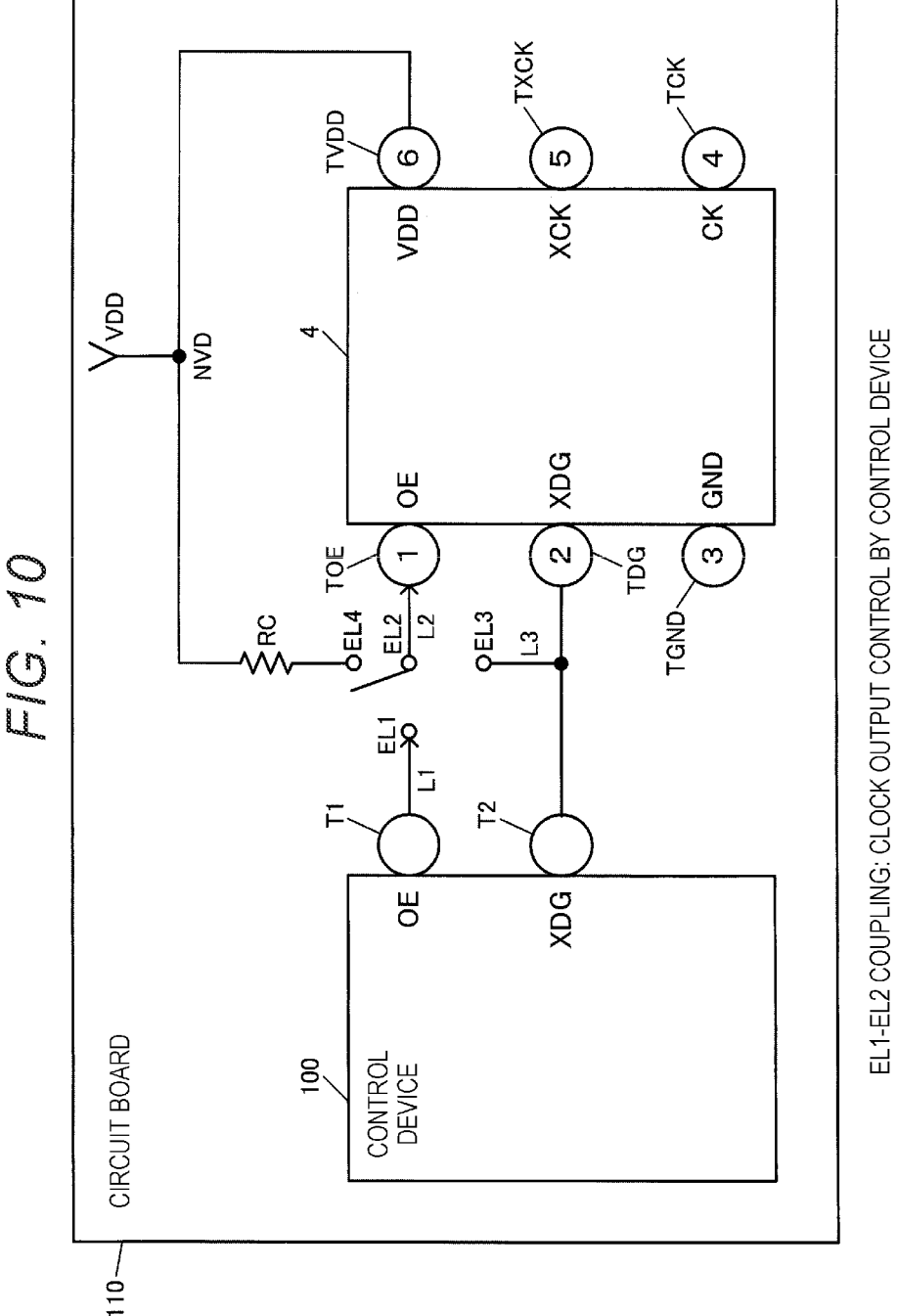
FIG. 10 is a configuration example of an electronic device including the oscillator.

FIG. 10 shows a configuration example of an electronic device 150 according to the embodiment. The electronic device 150 includes the oscillator 4 according to the embodiment and a circuit board 110 to which the oscillator 4 is provided. In addition, the electronic device 150 can include the control device 100. Further, the electronic device 150 can include a communication device, a storage device, a display device, a sound output device, an input device, and the like (not shown). The communication device is, for example, a device for performing communication with an in-vehicle network in a case of in-vehicle use. The storage device is implemented by, for example, a memory that stores various types of information. The display device is a device that displays information such as an image, and the sound output device is a device that outputs sound such as music or voice. The input device is a device for a user to input various types of information. For example, when the electronic device 150 is an audio visual device for in-vehicle use, the display device, the sound output device, the input device, or the like is provided.

Figure 5:
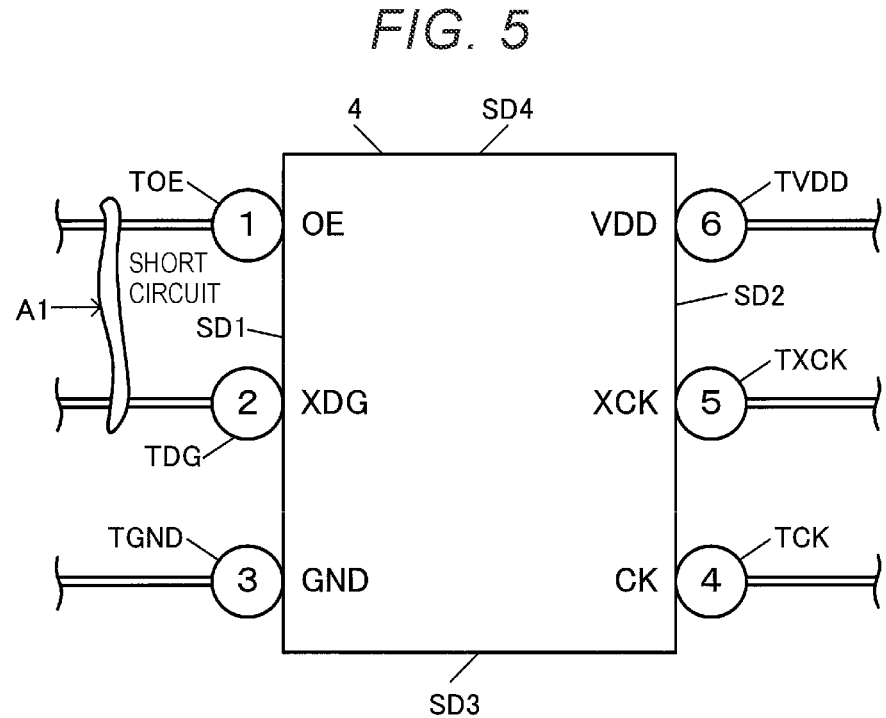
FIG. 5 is a diagram of a problem of a short circuit failure.

As described above, in the electronic device 150 including the oscillator 4 and the circuit board 110 to which the oscillator 4 is provided, a problem of a short circuit failure between the wiring of the output control terminal TOE and the wiring of the failure diagnosis terminal TDG may occur as described in FIG. 5 and the like. In this regard, in the embodiment, since the output control terminal TOE receives the output control signal having the first logic which is one of the positive logic and the negative logic, and the failure diagnosis terminal TDG outputs the failure diagnosis signal having the second logic which is the other one of the positive logic and the negative logic, such a problem can be prevented.

In FIG. 10, the electronic device 150 includes the control device 100 provided to the circuit board 110. The control device 100 is implemented by a microcontroller and the like as described above.

The control device 100 includes the first terminal T1 that outputs the output control signal OE and the second terminal T2 to which the failure diagnosis signal XDG is input.

The circuit board 110 includes a first electrode EL1, a second electrode EL2, and a third electrode EL3. The first electrode EL1 is electrically coupled to the first terminal T1 of the control device 100. For example, the first electrode EL1 is coupled to the first terminal T1 of the control device 100 via a first wiring L1 of the circuit board 110. The second electrode EL2 is electrically coupled to the output control terminal TOE of the oscillator 4. For example, the second electrode EL2 is coupled to the output control terminal TOE of the oscillator 4 via a second wiring L2 of the circuit board 110. The third electrode EL3 is electrically coupled to the failure diagnosis terminal TDG of the oscillator 4 and the second terminal T2 of the control device 100. For example, the third electrode EL3 is coupled to the failure diagnosis terminal TDG of the oscillator 4 and the second terminal T2 of the control device 100 via a third wiring L3. Here, the electrodes such as EL1, EL2, and EL3 are conductive patterns formed at the circuit board 110 to couple electronic components and the circuit board 110. For example, terminals of the electronic components are coupled to electrodes of the circuit board 110 by solder and the like. Specifically, the electrodes are, for example, lands or pads. The land is formed, for example, around a through hole, and is a portion to which a lead component of the electronic component is soldered through the hole. The pad is a portion to which an electronic component for surface installation is soldered.

When the first electrode EL1, the second electrode EL2, and the third electrode EL3 are provided as described above, the output control signal OE from the control device 100 is input to the output control terminal TOE of the oscillator 4 by electrically coupling the first electrode EL1 and the second electrode EL2. Accordingly, the clock output can be controlled by the control device 100. For example, the control device 100 sets the output control signal OE to the high level, so that the clock signals CK and XCK are output from the oscillator 4. The control device 100 sets the output control signal OE to the low level, so that the output of the clock signals CK and XCK from the oscillator 4 is stopped.

By electrically coupling the third electrode EL3 and the second electrode EL2, the failure diagnosis signal XDG output by the oscillator 4 is input to the output control terminal TOE of the oscillator 4. The clock output can be automatically controlled by the self-failure diagnosis of the oscillator 4. For example, the failure diagnosis signal XDG is at the high level, the failure diagnosis signal XDG at the high level is input to the output control terminal TOE, so that the oscillator 4 outputs the clock signals CK and XCK. On the other hand, when a failure is detected by the self-failure diagnosis of the oscillator 4 and the failure diagnosis signal XDG becomes at the low level, the failure diagnosis signal XDG at the low level is input to the output control terminal TOE, so that the output of the clock signals CK and XCK from the oscillator 4 is stopped. Accordingly, it is possible to automatically stop the clock output when a failure is detected. The reason why the clock output can be automatically controlled by the self-failure diagnosis of the oscillator 4 is that the output control terminal TOE receives the output control signal having the first logic which is one of the positive logic and the negative logic, and the failure diagnosis terminal TDG outputs the failure diagnosis signal having the second logic which is the other one of the positive logic and the negative logic In FIG. 10, the failure diagnosis terminal TDG of the oscillator 4 and the second terminal T2 of the control device 100 are coupled to each other via the third wiring L3. Accordingly, when the oscillator 4 detects a failure and the failure diagnosis signal XDG becomes at the low level, the control device 100 detects the failure diagnosis signal XDG at the low level, thereby recognizing that a failure has occurred in the oscillator 4.

Figure 11:
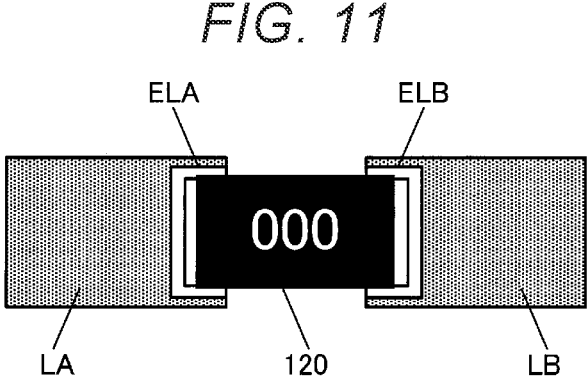
FIG. 11 is a diagram of a coupling element of an electrode.

In the embodiment, the first electrode EL1 and the second electrode EL2, or the third electrode EL3 and the second electrode EL2 are coupled to each other by a coupling element 120 as shown in FIG. 11, for example. Thus, by coupling the first electrode EL1 and the second electrode EL2 to each other by the coupling element 120, the clock output can be controlled by the output control signal OE from the control device 100, and the control of outputting the clock signals CK and XCK and stopping the output by the output control signal OE becomes possible. In addition, by coupling the third electrode EL3 and the second electrode EL2 to each other by the coupling element 120, the clock output can be automatically controlled by the self-failure diagnosis of the oscillator 4, and it is possible to automatically stop the output of the clock signals CK and XCK by the failure diagnosis signal XDG when a failure is detected.

For example, in the embodiment, the coupling element 120 such as a zero-ohms resistance element as shown in FIG. 11 can be used. An electrode ELA provided on the wiring LA and an electrode ELB provided on the wiring LB can be coupled by the coupling element 120. By using the coupling element 120, the first electrode EL1 and the second electrode EL2, or the third electrode EL3 and the second electrode EL2 can be coupled with low impedance. For example, in the circuit board 110 used for a first product, the first electrode EL1 and the second electrode EL2 can be coupled to each other by the coupling element 120 such as a zero-ohms resistance element, and in the circuit board 110 used for a second product, the third electrode EL3 and the second electrode EL2 can be coupled to each other by the coupling element 120 such as a zero-ohms resistance element. Accordingly, the same circuit board 110 can be used for various products, and various products can be provided at low cost. The coupling element 120 is not limited to the zero-ohms resistance element, and may be a switch element that is mechanically or electronically turned on or off.

In FIG. 10, the circuit board 110 includes a fourth electrode EL4. The fourth electrode EL4 is electrically coupled to one end of a resistor RC whose other end electrically coupled to the power supply node NVD of VDD.

The electrode of EL4 is also a conductive pattern formed at the circuit board 110 to couple the circuit board 110 and the electronic component, and is, for example, a land or a pad.

When the fourth electrode EL4 is provided, the fourth electrode EL4 and the second electrode EL2 are electrically coupled to each other, so that the output control terminal TOE can be normally set to the high level by the pull up of the resistor RC whose one end is coupled to the power supply node NVD of VDD, and the clock output can be constantly performed. That is, the oscillator 4 constantly outputs the clock signals CK and XCK.

In the embodiment, the first electrode EL1 and the second electrode EL2, the third electrode EL3 and the second electrode EL2, or the fourth electrode EL4 and the second electrode EL2 are coupled to each other by the coupling element 120. Thus, by coupling the first electrode EL1 and the second electrode EL2 to each other by the coupling element 120, the clock output can be controlled by the output control signal OE from the control device 100. In addition, by coupling the third electrode EL3 and the second electrode EL2 to each other by the coupling element 120, the clock output can be automatically controlled by the self-failure diagnosis of the oscillator 4. By coupling the fourth electrode EL4 and the second electrode EL2 to each other by the coupling element 120, the clock signals CK and XCK can be constantly output. Accordingly, the same circuit board 110 can be used for various products, and various products can be provided at low cost.

In the embodiment, the output control terminal TOE and the failure diagnosis terminal TDG are electrically coupled to each other in the circuit board 110. For example, in FIG. 10, the output control terminal TOE and the failure diagnosis terminal TDG can be electrically coupled by coupling the third electrode EL3 and the second electrode EL2 to each other by the coupling element 120 such as a zero-ohm coupling element. Alternatively, the output control terminal TOE and the failure diagnosis terminal TDG may be directly coupled by, for example, the wiring of the circuit board 110. By electrically coupling the output control terminal TOE and the failure diagnosis terminal TDG as described above, the clock output can be automatically controlled by the self-failure diagnosis of the oscillator 4. That is, when a failure is detected, the failure diagnosis signal XDG, which is a negative logic signal, is at, for example, a low level, so that the low level is input to the output control terminal TOE which is a positive logic terminal, and the output of the clock signals CK and XCK can be automatically stopped.

In the embodiment, as shown in FIG. 8, the circuit board 110 can include the first resistor RB1 provided between the output control terminal TOE and the power supply node NVD of VDD, and the second resistor RB2 provided between the failure diagnosis terminal TDG and the power supply node NVD of VDD. That is, the first resistor RB1 and the second resistor RB2 are provided to the circuit board 110. Thus, as described in FIGS. 8 and 9, it is possible to implement a serial communication mode in which the serial clock signal SCL is input to the failure diagnosis terminal TDG and the serial data SDA is input or output via the output control terminal TOE. For example, when the control device

100 does not output the serial clock signal SCL, the wiring LB between the second terminal T2 of the control device 100 and the failure diagnosis terminal TDG of the oscillator 4 is maintained at a high level due to the pull up by the second resistor RB2. When the serial data SDA is not transferred, the wiring LA between the first terminal T1 of the control device 100 and the output control terminal TOE of the oscillator 4 is maintained at a high level due to the pull up by the first resistor RB1.

5. Oscillator

FIG. 12 shows a first structural example of the oscillator 4 according to the embodiment. The oscillator 4 includes the resonator 10, the circuit device 20, and the package 15 that accommodates the resonator 10 and the circuit device 20. The package 15 is formed of, for example, ceramic, and has an accommodation space therein. The resonator 10 and the circuit device 20 are accommodated in the accommodation space. The accommodation space is hermetically sealed and is preferably in a depressurized state close to a vacuum. The package 15 can preferably protect the resonator 10 and the circuit device 20 from impact, dust, heat, humidity, and the like.

The package 15 includes the base 16 and a lid 17. Specifically, the package 15 includes the base 16 that supports the resonator 10 and the circuit device 20, and the lid 17 bonded to an upper surface of the base 16 such that the accommodation space is formed between the lid 17 and the base 16. The resonator 10 is supported, via a terminal electrode, by a step portion provided in the base 16.

The circuit device 20 is disposed on an inner bottom surface of the base 16. Specifically, the circuit device 20 is disposed such that an active surface thereof faces the inner bottom surface of the base 16. The active surface is a surface on which a circuit element of the circuit device 20 is formed. In addition, a bump BMP is formed on a terminal of the circuit device 20. The circuit device 20 is supported on the inner bottom surface of the base 16 via the conductive bump BMP. The conductive bump BMP is, for example, a metal bump, and the resonator 10 and the circuit device 20 are electrically coupled via the bump BMP, an internal wiring of the package 15, the terminal electrode, and the like. In addition, the circuit device 20 is electrically coupled to external terminals 18 and 19 of the oscillator 4 via the bump BMP and the internal wiring of the package 15. The external terminals 18 and 19 are formed on an outer bottom surface of the package 15. The external terminals 18 and 19 are coupled to an external device via an external wiring. The external wiring is, for example, a wiring formed on a circuit board to which the external device is provided. Accordingly, a clock signal and the like can be output to the external device.

The external terminals 18 and 19 correspond to the output control terminal TOE, the failure diagnosis terminal TDG, the ground terminal TGND, the clock terminals TCK and TXCK, and the power supply terminal TVDD described in FIGS. 1 to 4. For example, the output control terminal TOE, the failure diagnosis terminal TDG, and the ground terminal TGND are arranged along a first side of the outer bottom surface of the package 15 of the oscillator 4, and the power supply terminal TVDD, the clock terminals TXCK and TCK are arranged along a second side which is the opposite side of the first side of the outer bottom surface.

In FIG. 12, the circuit device 20 is flip-provided such that the active surface of the circuit device 20 faces downward, and the embodiment is not limited to such installation. For example, the circuit device 20 may be provided such that the active surface of the circuit device 20 faces upward. That is, the circuit device 20 is provided such that the active surface faces the resonator 10.

FIG. 13 shows a second structural example of the oscillator 4. The oscillator 4 includes the resonator 10, the circuit device 20, and the package 15 that accommodates the resonator 10 and the circuit device 20. The package 15 includes the base 16 and the lid 17. The base 16 includes a first substrate 6 that is an intermediate substrate, a second substrate 7 stacked on an upper surface of the first substrate 6 and having a substantially rectangular frame shape, and a third substrate 8 stacked on a bottom surface of the first substrate 6 and having a substantially rectangular frame shape. The lid 17 is bonded to an upper surface of the second substrate 7, and the resonator 10 is accommodated in an accommodation space S1 defined by the first substrate 6, the second substrate 7, and the lid 17. For example, the resonator 10 is hermetically sealed in the accommodation space S1 and is preferably in a depressurized state close to a vacuum. Accordingly, the resonator 10 can be preferably protected from impact, dust, heat, humidity, and the like. In addition, the circuit device 20 which is a semiconductor chip is accommodated in an accommodation space S2 defined by the first substrate and the third substrate 8. In addition, the external terminals 18 and 19 which are electrode terminals for external coupling of the oscillator 4 are formed on a bottom surface of the third substrate 8.

In the accommodation space S1, the resonator 10 is coupled, by conductive coupling portions CDC1 and CDC2, to a first electrode terminal and a second electrode terminal (not shown) formed on the upper surface of the first substrate 6.

The conductive coupling portions CDC1 and CDC2 may be implemented by conductive bumps such as metal bumps or may be implemented by conductive adhesives. Specifically, for example, a first electrode pad (not shown) formed on one end of the tuning fork type resonator 10 is coupled, via the conductive coupling portion CDC1, to the first electrode terminal formed on the upper surface of the first substrate 6. The first electrode terminal is electrically coupled to the pad PX1 of the circuit device 20. In addition, a second electrode pad (not shown) formed on the other end of the tuning fork type resonator 10 is coupled, via the conductive coupling portion CDC2, to the second electrode terminal formed on the upper surface of the first substrate 6. The second electrode terminal is electrically coupled to the pad PX2 of the circuit device 20. Accordingly, the one end and the other end of the resonator 10 can be electrically coupled to the pads PX1 and PX2 of the circuit device 20 via the conductive coupling portions CDC1 and CDC2. In addition, the conductive bumps BMP are formed on a plurality of pads of the circuit device 20 which is a semiconductor chip, and the conductive bumps BMP are coupled to a plurality of electrode terminals formed on the bottom surface of the first substrate 6. The electrode terminals coupled to the pads of the circuit device 20 are electrically coupled to the external terminals 18 and 19 of the oscillator 4 via an internal wiring and the like.

The external terminals 18 and 19 correspond to the output control terminal TOE, the failure diagnosis terminal TDG, the ground terminal TGND, the clock terminals TCK and TXCK, and the power supply terminal TVDD described in FIGS. 1 to 4.

The oscillator 4 may be an oscillator of a wafer-level package (WLP). In this case, the oscillator 4 includes a base including a semiconductor substrate and a through electrode penetrating the semiconductor substrate between a first surface and a second surface of the semiconductor substrate, the resonator 10 fixed to the first surface of the semiconductor substrate via a conductive bonding member such as a metal bump, and an external terminal provided on the second surface side of the semiconductor substrate via an insulating layer such as a rearrangement wiring layer. An integrated circuit to be the circuit device 20 is formed on the first surface or the second surface of the semiconductor substrate. In this case, a first semiconductor wafer, on which a plurality of bases on which the resonator 10 and the integrated circuit are disposed are formed, and a second semiconductor wafer on which a plurality of lids are formed are bonded to each other, so that the plurality of bases and the plurality of lids are bonded to each other. Thereafter, singulation of the oscillator 4 is performed by a dicing saw and the like. Thus, the oscillator 4 of the wafer-level package can be implemented, and the oscillator 4 can be manufactured at high throughput and low cost.

As described above, an oscillator according to the embodiment includes: a power supply terminal to which a high-potential-side power supply voltage is supplied; a ground terminal to which a low-potential-side power supply voltage is supplied; a clock terminal configured to output a clock signal; an output control terminal to which an output control signal of the clock signal is input; and a failure diagnosis terminal configured to output a failure diagnosis signal. The output control terminal is configured to receive the output control signal having a first logic which is one of a positive logic and a negative logic, and the failure diagnosis terminal is configured to output the failure diagnosis signal having a second logic which is the other one of the positive logic and the negative logic.

According to the embodiment, when the output control signal is a positive logic signal, the failure diagnosis signal is a negative logic signal, and when the output control signal is a negative logic signal, the failure diagnosis signal is a positive logic signal. Therefore, when a short circuit failure occurs, it is possible to prevent the clock signals from being stopped. Accordingly, it is possible to provide an oscillator and the like which can implement failure diagnosis and prevent occurrence of a problem caused by a short circuit failure and the like.

In the embodiment, the clock terminal may output the clock signal when the output control signal at a first level, which is one of a high level and a low level, is input to the output control terminal, and may not output the clock signal when the output control signal at a second level, which is the other one of the high level and the low level, is input to the output control terminal. The failure diagnosis terminal may output the failure diagnosis signal at the first level or be set to a high impedance state when operating normally, and may output the failure diagnosis signal at the second level when a failure is detected.

Thus, when the output control signal at the first level is input to the output control terminal and the oscillator normally operates to output the clock signal, the failure diagnosis terminal outputs the failure diagnosis signal at the same first level, or the failure diagnosis terminal is set to be at the high impedance state.

In the embodiment, the output control terminal and the failure diagnosis terminal may be arranged side by side.

Thus, for example, a terminal aligned with the output control terminal can be assigned to the failure diagnosis terminal, and the failure diagnosis signal can be output.

In the embodiment, the output control terminal and the failure diagnosis terminal may be arranged side by side along a first side of the oscillator.

When the output control terminal and the failure diagnosis terminal are disposed along the first side of the oscillator as described above, the problem of the short circuit failure is likely to occur. However, even when such a short circuit failure occurs, it is possible to prevent a problem such as the stop of the clock output.

In the embodiment, a positive side clock terminal configured to output a positive side clock signal of a differential clock signal, which is the clock signal, and a negative side clock terminal configured to output a negative side clock signal of the differential clock signal may be provided as the clock terminals. The output control terminal, the failure diagnosis terminal, and the ground terminal may be arranged in an order of the output control terminal, the failure diagnosis terminal, and the ground terminal along the first side of the oscillator. The power supply terminal, the negative side clock terminal, and the positive side clock terminal may be arranged in an order of the power supply terminal, the negative side clock terminal, and the positive side clock terminal along a second side which is an opposite side of the first side of the oscillator.

Thus, in a differential output type six-terminal oscillator that outputs the differential clock signal, the failure diagnosis terminal can be provided to output the failure diagnosis signal.

The embodiment may further include a resonator and a circuit device. The circuit device may include an oscillation circuit configured to oscillate the resonator, an output circuit configured to output, to the clock terminal, the clock signal based on an oscillation clock signal from the oscillation circuit, a control circuit to which the output control signal is input, and a failure diagnosis circuit configured to perform failure diagnosis for generating the failure diagnosis signal.

Thus, the clock signal generated by causing the oscillation circuit to oscillate the resonator can be output from the clock terminal by the output circuit. The failure diagnosis signal based on the failure diagnosis of the failure diagnosis circuit is output via the failure diagnosis terminal, so that a result of the failure diagnosis of the oscillator can be transmitted to the outside.

In the embodiment, the oscillator may further include a serial communication circuit. In a serial communication mode in which serial communication is performed by the serial communication circuit, a serial clock signal may be input to the failure diagnosis terminal, and serial data may be input or output via the output control terminal.

Thus, the failure diagnosis terminal and the output control terminal can be used both as a terminal for inputting the serial clock signal and a terminal for inputting and outputting the serial data for the serial communication.

In the embodiment, the serial communication by the serial communication circuit may be communication of a standard detected as a clock stretch when the serial clock signal is at a low level for a given period.

Thus, when the failure of the oscillator is detected in the serial communication mode, the oscillator is switched from the serial communication mode to the normal operation mode, and the failure diagnosis signal at the low level is output from the failure diagnosis terminal, the state of the low level can be detected as the clock stretch.

An electronic device according to the embodiment includes: the oscillator described above; and a circuit board to which the oscillator is installed.

Thus, it is possible to implement the failure diagnosis in the electronic device including the oscillator and the circuit board, and it is also possible to prevent the occurrence of the problem caused by the short circuit failure and the like.

In the embodiment, the electronic device may further include a control device that is installed to the circuit board and includes a first terminal that outputs the output control signal and a second terminal to which the failure diagnosis signal is input. The circuit board may include a first electrode electrically coupled to the first terminal of the control device, a second electrode electrically coupled to the output control terminal of the oscillator, and a third electrode electrically coupled to the failure diagnosis terminal of the oscillator and the second terminal of the control device.

Thus, by electrically coupling the first electrode and the second electrode, the output control signal from the control device is input to the output control terminal of the oscillator, and the clock output can be controlled by the control device. In addition, by electrically coupling the third electrode and the second electrode, the failure diagnosis signal output by the oscillator is input to the output control terminal of the oscillator, and the clock output can be automatically controlled by self-failure diagnosis of the oscillator.

In the embodiment, the first electrode and the second electrode, or the third electrode and the second electrode may be coupled to each other by a coupling element.

Thus, the clock output can be controlled by the output control signal from the control device by coupling the first electrode and the second electrode to each other by the coupling element, and the clock output can be automatically controlled by the self-failure diagnosis of the oscillator by coupling the third electrode and the second electrode to each other by the coupling element.

In the embodiment, the circuit board may include a fourth electrode electrically coupled to one end of a resistor whose the other end is electrically coupled to a power supply node.

Thus, by electrically coupling the fourth electrode and the second electrode, the output control terminal can be set to be at a level of the power supply voltage, and the clock output can be constantly performed.

In the embodiment, the first electrode and the second electrode, the third electrode and the second electrode, or the fourth electrode and the second electrode may be coupled to each other by a coupling element.

Thus, the clock output can be controlled by the output control signal from the control device by coupling the first electrode and the second electrode to each other by the coupling element, and the clock output can be automatically controlled by the self-failure diagnosis by coupling the third electrode and the second electrode to each other by the coupling element. In addition, by coupling the fourth electrode and the second electrode to each other by the coupling element, the clock signal can be constantly output.

In the embodiment, the output control terminal and the failure diagnosis terminal may be electrically coupled to each other on the circuit board.

Thus, the clock output can be automatically controlled by the self-failure diagnosis of the oscillator.

In the embodiment, the circuit board may include a first resistor provided between the output control terminal and the power supply node, and a second resistor provided between the failure diagnosis terminal and the power supply node.

Thus, a serial communication mode and the like using the failure diagnosis terminal and the output control terminal can be implemented.

Although the embodiment is described in detail above, it can be easily understood by those skilled in the art that a number of modifications are possible without substantially departing from the novel matters and effects of the disclosure. Accordingly, all such modifications are within the scope of the disclosure. For example, a term described at least once together with a different term having a broader meaning or the same meaning in the description or the drawings can be replaced with the different term at any place in the description or the drawings. All combinations of the embodiment and the modifications are also included in the scope of the disclosure. The configurations, operations, and the like of the oscillator, the circuit device, and the electronic device are not limited to those described in the embodiment, and various modifications can be made.

What is claimed is:

1. An oscillator comprising:
a power supply terminal to which a high-potential-side power supply voltage is supplied;
a ground terminal to which a low-potential-side power supply voltage is supplied;
a clock terminal configured to output a clock signal;
an output control terminal to which an output control signal of the clock signal is input; and
a failure diagnosis terminal configured to output a failure diagnosis signal, wherein
the output control terminal is configured to receive the output control signal having a first logic which is one of a positive logic and a negative logic, and
the failure diagnosis terminal is configured to output the failure diagnosis signal having a second logic which is the other one of the positive logic and the negative logic.

2. The oscillator according to claim 1, wherein
the clock terminal
outputs the clock signal when the output control signal at a first level, which is one of a high level and a low level, is input to the output control terminal, and
does not output the clock signal when the output control signal at a second level, which is the other one of the high level and the low level, is input to the output control terminal, and
the failure diagnosis terminal
outputs the failure diagnosis signal at the first level or is set to a high impedance state when operating normally, and
outputs the failure diagnosis signal at the second level when a failure is detected.

3. The oscillator according to claim 1, wherein
the output control terminal and the failure diagnosis terminal are arranged side by side.

4. The oscillator according to claim 1, wherein
the output control terminal and the failure diagnosis terminal are arranged side by side along a first side of the oscillator.

5. The oscillator according to claim 1, wherein
a positive side clock terminal configured to output a positive side clock signal of a differential clock signal, which is the clock signal, and a negative side clock terminal configured to output a negative side clock signal of the differential clock signal are provided as the clock terminals,
the output control terminal, the failure diagnosis terminal, and the ground terminal are arranged in an order of the output control terminal, the failure diagnosis terminal, and the ground terminal along a first side of the oscillator, and
the power supply terminal, the negative side clock terminal, and the positive side clock terminal are arranged in an order of the power supply terminal, the negative side clock terminal, and the positive side clock terminal along a second side which is an opposite side of the first side of the oscillator.

6. The oscillator according to claim 1, further comprising:
a resonator; and
a circuit device, wherein
the circuit device includes
an oscillation circuit configured to oscillate the resonator,
an output circuit configured to output, to the clock terminal, the clock signal based on an oscillation clock signal from the oscillation circuit,
a control circuit to which the output control signal is input, and
a failure diagnosis circuit configured to perform failure diagnosis for generating the failure diagnosis signal.

7. The oscillator according to claim 6, further comprising:
a serial communication circuit, wherein
in a serial communication mode in which serial communication is performed by the serial communication circuit, a serial clock signal is input to the failure diagnosis terminal, and serial data is input or output via the output control terminal.

8. The oscillator according to claim 7, wherein
the serial communication by the serial communication circuit is communication of a standard detected as a clock stretch when the serial clock signal is at a low level for a given period.

9. An electronic device comprising:
the oscillator according to claim 1; and
a circuit board to which the oscillator is installed.

10. The electronic device according to claim 9, further comprising:
a control device that is provided to the circuit board and includes a first terminal that outputs the output control signal and a second terminal to which the failure diagnosis signal is input, wherein
the circuit board includes
a first electrode electrically coupled to the first terminal of the control device,
a second electrode electrically coupled to the output control terminal of the oscillator, and
a third electrode electrically coupled to the failure diagnosis terminal of the oscillator and the second terminal of the control device.

11. The electronic device according to claim 10, wherein
the first electrode and the second electrode, or the third electrode and the second electrode are coupled to each other by a coupling element.

12. The electronic device according to claim 10, wherein
the circuit board includes a fourth electrode electrically coupled to one end of a resistor whose the other end is electrically coupled to a power supply node.

13. The electronic device according to claim 12, wherein
the first electrode and the second electrode, the third electrode and the second electrode, or the fourth electrode and the second electrode are coupled to each other by a coupling element.

14. The electronic device according to claim 9, wherein
the output control terminal and the failure diagnosis terminal are electrically coupled to each other at the circuit board.

15. The electronic device according to claim 9, wherein
the circuit board includes
a first resistor provided between the output control terminal and a power supply node, and a second resistor provided between the failure diagnosis terminal and the power supply node.

\* \* \* \* \*